United States Patent
Deguchi

(10) Patent No.: US 8,212,603 B2
(45) Date of Patent: Jul. 3, 2012

(54) MIXER CIRCUIT

(75) Inventor: Jun Deguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 72 days.

(21) Appl. No.: 12/894,250

(22) Filed: Sep. 30, 2010

(65) Prior Publication Data

US 2011/0037510 A1   Feb. 17, 2011

Related U.S. Application Data

(62) Division of application No. 12/426,578, filed on Apr. 20, 2009, now Pat. No. 7,825,716.

(51) Int. Cl.
*G06G 7/44* (2006.01)

(52) U.S. Cl. ........................ 327/359; 327/356

(58) Field of Classification Search .......... 327/355–359; 455/326, 333
See application file for complete search history.

(56) References Cited

U.S. PATENT DOCUMENTS

| | | | |
|---|---|---|---|
| 6,255,889 B1 | 7/2001 | Branson | |
| 6,404,263 B1 * | 6/2002 | Wang | 327/359 |
| 6,828,844 B2 | 12/2004 | Suzuki et al. | |
| 6,859,085 B2 | 2/2005 | Watanabe et al. | |
| 6,937,849 B2 | 8/2005 | Kluge et al. | |
| 7,110,740 B2 | 9/2006 | Miyashita | |
| 7,242,236 B2 | 7/2007 | Krug et al. | |
| 7,554,381 B2 | 6/2009 | Belot et al. | |
| 7,746,151 B2 | 6/2010 | Beck | |
| 7,825,716 B1 * | 11/2010 | Deguchi | 327/359 |
| 7,915,943 B2 * | 3/2011 | Yotsuji | 327/356 |

FOREIGN PATENT DOCUMENTS

| | | |
|---|---|---|
| JP | 6-334440 | 12/1994 |
| JP | 2003-283254 | 10/2003 |
| JP | 3520175 | 2/2004 |

OTHER PUBLICATIONS

Office Action issued Feb. 15, 2011 in Japan Application No. 2008-166992 (With English Abstract).

* cited by examiner

*Primary Examiner* — Hai L Nguyen

(74) *Attorney, Agent, or Firm* — Oblon, Spivak, McClelland, Maier & Neustadt, L.L.P.

(57) ABSTRACT

In a mixer circuit, addition of analog signals by capacitive coupling is used and square-law characteristics of the drain current of a MOS transistor operating in a saturated region are used. With this configuration, the voltage and power of the mixer circuit can be reduced.

8 Claims, 14 Drawing Sheets

600

MIXER CIRCUIT

CROSS-REFERENCE TO RELATED APPLICATIONS

This application is a division of and claims the benefit of priority under 35 U.S.C. §120 from U.S. Ser. No. 12/426,578 filed Apr. 20, 2009, the entire contents of which are incorporated herein by reference.

BACKGROUND OF THE INVENTION

1. Field of the Invention

The present invention relates to a mixer circuit used for a large scale integration (LSI) for radio communications.

2. Background Art

In radio communications of the prior art, mixer circuits for frequency converting radio frequency (RF) signals have been used.

As technology scaling arises with the development of CMOS process technology, a reduction in power supply voltage has become a serious problem in the design of future RF analog circuits. Further, since RF analog circuits have been increasingly mounted in portable equipment, another significant challenge is to operate LSIs for radio communications, on which RF analog circuits are mounted, with low power.

However, the mixer circuits used for LSIs according to the prior art have been mainly made up of MOS transistors stacked in two stages or more, so that the mixer circuits of the prior art are not suitable for low-voltage operations.

In order to solve this problem, mixer circuits for low-voltage operations (a circuit of a mixer core and an adding circuit of analog signals) have been proposed (for example, see Japanese Patent No. 3520175).

In order to achieve a mixer circuit with this circuit configuration, however, an adding circuit of analog signals is necessary.

When analog signals are added by the adding circuit, power is consumed because of the DC bias currents of MOS transistors.

Thus it is difficult for the mixer circuit of the prior art to have a low-power adding circuit, though the mixer circuit can achieve low-voltage operations.

SUMMARY OF THE INVENTION

According to one aspect of the present invention, there is provided: a mixer circuit comprising:
a first input terminal fed with a first voltage signal;
a second input terminal fed with a second voltage signal;
a third input terminal fed with a third voltage signal equivalent to an inverted signal of the first voltage signal;
a fourth input terminal fed with a fourth voltage signal equivalent to an inverted signal of the second voltage signal;
a fifth input terminal fed with the first voltage signal;
a sixth input terminal fed with the fourth voltage signal;
a seventh input terminal fed with the second voltage signal;
a first resistor circuit comprising one end connected to a first potential;
a first output terminal connected to an other end of the first resistor circuit;
a first transistor connected between the other end of the first resistor circuit and a second potential;
a first impedance element connected between the first input terminal and a control electrode of the first transistor;
a second impedance element connected between the second input terminal and the control electrode of the first transistor;
a second transistor of a same conductivity type as the first transistor, the second transistor being connected in parallel with the first transistor between the other end of the first resistor circuit and the second potential;
a third impedance element connected between the third input terminal and a control electrode of the second transistor;
a fourth impedance element connected between the fourth input terminal and the control electrode of the second transistor;
a second resistor circuit comprising one end connected to the first potential;
a second output terminal connected to an other end of the second resistor circuit;
a third transistor of the same conductivity type as the first transistor, the third transistor being connected between the other end of the second resistor circuit and the second potential;
a fifth impedance element connected between the fifth input terminal and a control electrode of the third transistor;
a sixth impedance element connected between the sixth input terminal and the control electrode of the third transistor;
a fourth transistor of the same conductivity type as the first transistor, the fourth transistor being connected in parallel with the third transistor between the other end of the second resistor circuit and the second potential;
a seventh impedance element connected between the third input terminal and a control electrode of the fourth transistor; and
an eighth impedance element connected between the seventh input terminal and the control electrode of the fourth transistor.

According to the other aspect of the present invention, there is provided: a mixer circuit comprising:
a first input terminal fed with a first voltage signal;
a second input terminal fed with a second voltage signal;
a third input terminal fed with a third voltage signal equivalent to an inverted signal of the first voltage signal;
a fourth input terminal fed with a fourth voltage signal equivalent to an inverted signal of the second voltage signal;
a fifth input terminal fed with the first voltage signal;
a sixth input terminal fed with the fourth voltage signal;
a seventh input terminal fed with the second voltage signal;
an eighth input terminal fed with the third voltage signal;
a ninth input terminal fed with the second voltage signal;
a tenth input terminal fed with the first voltage signal;
a eleventh input terminal fed with the fourth voltage signal;
a twelfth input terminal fed with the third voltage signal;
a thirteenth input terminal fed with the fourth voltage signal;
a fourteenth input terminal fed with the second voltage signal;
a first transistor comprising one end connected to a first potential;
a first output terminal connected to an other end of the first transistor;
a first impedance element connected between the first input terminal and a control electrode of the first transistor;
a second impedance element connected between the second input terminal and the control electrode of the first transistor;
a second transistor of a same conductivity type as the first transistor, the second transistor being connected in parallel with the first transistor between the first output terminal and the first potential;

a third impedance element connected between the third input terminal and a control electrode of the second transistor;

a fourth impedance element connected between the fourth input terminal and the control electrode of the second transistor;

a third transistor of the same conductivity type as the first transistor, the third transistor comprising one end connected to the first potential;

a second output terminal connected to an other end of the third transistor;

a fifth impedance element connected between the fifth input terminal and a control electrode of the third transistor;

a sixth impedance element connected between the sixth input terminal and the control electrode of the third transistor;

a fourth transistor of the same conductivity type as the first transistor, the fourth transistor being connected in parallel with the third transistor between the second output terminal and the first potential;

a seventh impedance element connected between the third input terminal and a control electrode of the fourth transistor;

an eighth impedance element connected between the seventh input terminal and the control electrode of the fourth transistor, a fifth transistor of a second conductivity type different from the first conductivity type, the fifth transistor being connected between the first output terminal and a second potential;

a ninth impedance element connected between the eighth input terminal and a control electrode of the fifth transistor;

a tenth impedance element between the ninth input terminal and the control electrode of the fifth transistor;

a sixth transistor of a same conductivity type as the fifth transistor, the sixth transistor being connected in parallel with the fifth transistor between the first output terminal and the second potential;

an eleventh impedance element connected between the tenth input terminal and a control electrode of the sixth transistor;

a twelfth impedance element connected between the eleventh input terminal and the control electrode of the sixth transistor;

a seventh transistor of the same conductivity type as the fifth transistor, the seventh transistor being connected between the second output terminal and the second potential;

a thirteenth impedance element connected between the twelfth input terminal and a control electrode of the seventh transistor;

a fourteenth impedance element connected between the thirteenth input terminal and the control electrode of the seventh transistor;

an eighth transistor of the same conductivity type as the fifth transistor, the eighth transistor being connected in parallel with the seventh transistor between the second output terminal and the second potential;

a fifteenth impedance element connected between the tenth input terminal and a control electrode of the eighth transistor; and a sixteenth impedance element connected between the fourteenth input terminal and the control electrode of the eighth transistor.

According to further aspect of the present invention, there is provided: a mixer circuit comprising:

a first adder configured to output a first output signal by adding a first voltage signal and a second voltage signal;

a second adder configured to output a second output signal by adding an inverted signal of the first voltage signal and an inverted signal of the second voltage signal;

a third adder configured to output a third output signal by adding the inverted signal of the first voltage signal and the second voltage signal;

a fourth adder configured to output a fourth output signal by adding the first voltage signal and the inverted signal of the second voltage signal;

a first square circuit configured to output a fifth output signal by squaring the first output signal;

a second square circuit configured to output a sixth output signal by squaring the second output signal;

a third square circuit configured to output a seventh output signal by squaring the third output signal; and a fourth square circuit configured to output a eighth output signal by squaring the fourth output signal.

According to still further aspect of the present invention, there is provided: a mixer circuit comprising:

a first adder comprising a first input terminal fed with a first voltage signal and a second input terminal fed with a second voltage signal, and configured to output a first output signal by adding the first voltage signal and the second voltage signal;

a second adder comprising a third input terminal fed with an inverted signal of the first voltage signal and a fourth input terminal fed with an inverted signal of the second voltage signal, and configured to output a second output signal by adding the inverted signal of the first voltage signal and the inverted signal of the second voltage signal;

a third adder comprising a fifth input terminal fed with the inverted signal of the first voltage signal and a sixth input terminal fed with the second voltage signal, and configured to output a third output signal by adding the inverted signal of the first voltage signal and the second voltage signal;

a fourth adder comprising a seventh input terminal fed with the first voltage signal and a eighth input terminal fed with the inverted signal of the second voltage signal, and configured to output a fourth output signal by adding the first voltage signal and the inverted signal of the second voltage signal;

a first square circuit comprising a ninth input terminal fed with the first output signal and a first output terminal to output a fifth output signal by squaring the first output signal;

a second square circuit comprising a tenth input terminal fed with the second output signal and a second output terminal to output a sixth output signal by squaring the second output signal;

a third square circuit comprising a eleventh input terminal fed with the third output signal and a third output terminal to output a seventh output signal by squaring the third output signal; and a fourth square circuit comprising a twelfth input terminal fed with the fourth output signal and a fourth output terminal to output a eighth output signal by squaring the fourth output signal.

DETAILED DESCRIPTION

Figure 1:
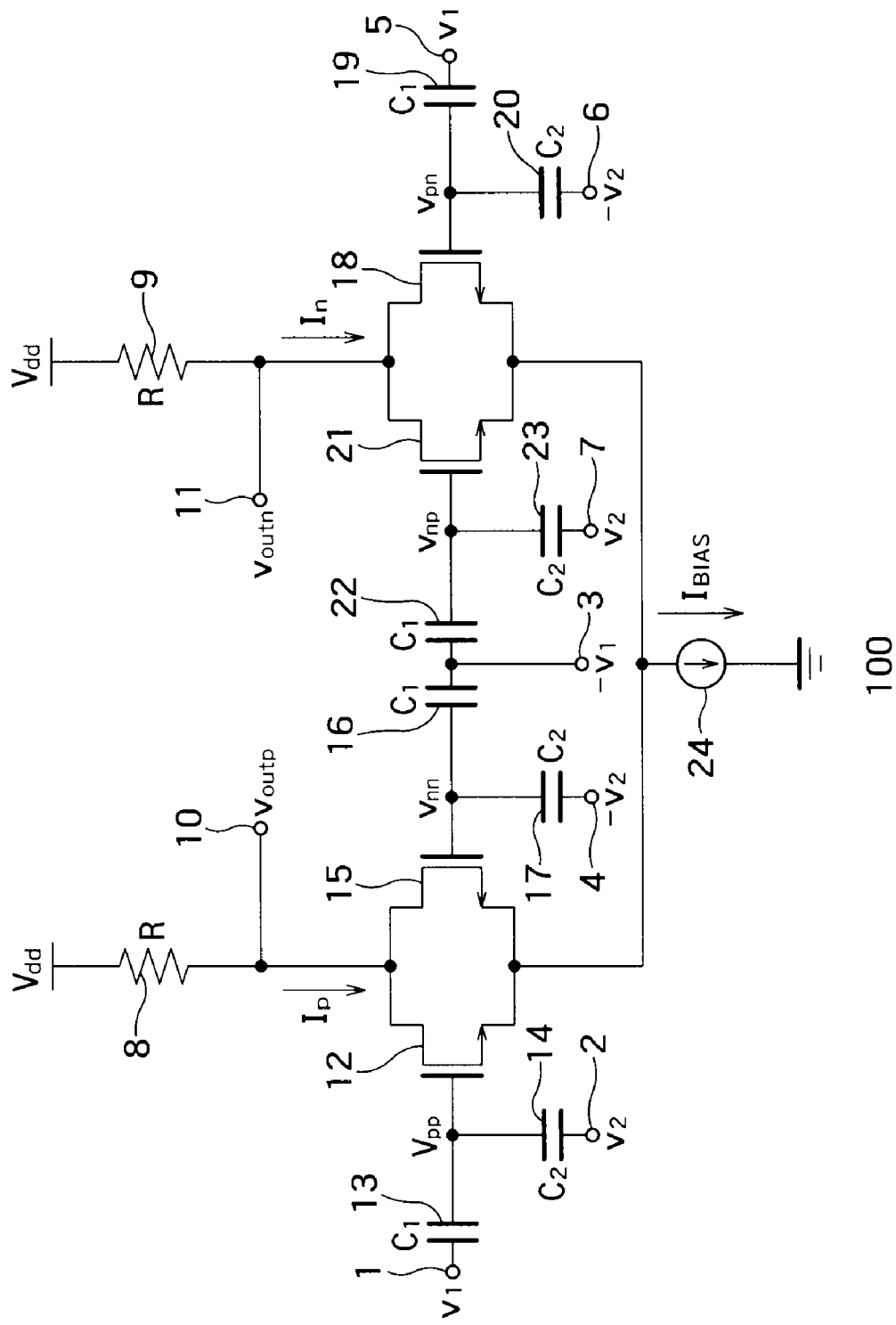
FIG. 1 is a circuit diagram showing the main configuration of the mixer circuit according to a first embodiment which is an aspect of the present invention.

In the following explanation, it is assumed that NMOS transistors composing the mixer circuit of the prior art are operated in a saturated region. In this case, drain currents "$I_{dsn}$" of the NMOS transistors are expressed by formulas (1) and (2). For simplification, a channel length modulation effect is ignored.

In formula (1), "Vgs" represents a gate-to-source voltage and "$V_{thn}$" represents the threshold voltage of the NMOS transistor. In formula (2), "$\mu_n$" represents the mobility of electrons, "$C_{ox}$" represents the thickness of the gate oxide film of the transistor, and "$W_n$" and "$L_n$" represent the gate width and gate length of the NMOS transistor.

$$I_{dsn} = \frac{1}{2}\beta_n(V_{gs} - V_{thn})^2 \quad (1)$$

$$\beta_n = \mu_n C_{ox} \frac{W_n}{L_n} \quad (2)$$

As expressed in formulas (1) and (2), the drain current "$I_{dsn}$" of each NMOS transistor has square-law characteristics.

In this case, a difference "$I_p-I_n$" between two output currents from the circuit of a mixer core is expressed by formula (3).

In formula (3), "$v_1$" and "$v_2$" represent the input voltages (AC voltages) of the mixer circuit. In formula (3), a DC voltage is canceled and thus is not considered. Further, voltages inputted to the mixer core are represented as $v_1+v_2(-v_1-v_2)$ and $v_1-v_2(-v_1+v_2)$. The input voltages of the mixer core are generated by adding input voltages $v_1(-v_1)$ and $v_2(-v_2)$ of the mixer circuit through an adding circuit of analog signals.

$$I_p-I_n=4\beta_n v_1 v_2 \quad (3)$$

As expressed in formula (3), by determining a difference between the two output currents, it is possible to multiply "$v_1$" and "$v_2$" which are the input signals of the mixer circuit.

Further, when a difference "$I_p-I_n$" between the two output currents is converted to a voltage output by a resistance "R", a difference "$V_{outp}-V_{outn}$" between the two output voltages is expressed by formula (4).

$$V_{outp}-V_{outn}=-4R\beta_n v_1 v_2 \quad (4)$$

In the circuit of the mixer core, the transistors are stacked in a single stage between a power supply and the ground and this configuration is suitable for low-voltage operations.

In the present invention, analog signals are added by a configuration where power is not consumed because of the DC bias currents of transistors, thereby reducing the voltage and power of the mixer circuit.

Embodiments to which the present invention is applied will be described below with reference to the accompanying drawings. In the following embodiments, transistors composing mixer circuits are MOS transistors.

First Embodiment

The present embodiment will describe an example of a mixer circuit in which analog signals inputted to input terminals are added by capacitive coupling. In the present embodiment, the addition of the analog signals by capacitive coupling is used and the square-law characteristics of the drain current of a MOS transistor operating in a saturated region are used. With this configuration, the voltage and power of the mixer circuit can be reduced.

Further, in the present embodiment, a first potential is a power supply potential and a second potential is a ground potential. Moreover, MOS transistors are n-type MOS transistors. The control electrodes of the transistors correspond to the gate electrodes of the MOS transistors.

On the gate of each MOS transistor, a DC voltage is biased but is canceled in the examination of output characteristics. Thus a direct current is not considered in the present embodiment.

Particularly in a radio transmitter, undesired spuriousness is disadvantageous and is caused by a distortion occurring in a quadrature modulator (mixer circuit).

FIG. 1 is a circuit diagram showing the main configuration of the mixer circuit according to a first embodiment which is an aspect of the present invention.

As shown in FIG. 1, a mixer circuit 100 includes a first input terminal 1, a second input terminal 2, a third input terminal 3, a fourth input terminal 4, a fifth input terminal 5, a sixth input terminal 6, and a seventh input terminal 7.

The first input terminal 1 is fed with a first voltage signal $v_1$ which is an analog signal.

The second input terminal 2 is fed with a second voltage signal $v_2$ which is an analog signal.

The third input terminal 3 is fed with a third voltage signal $(-v_1)$ which is equivalent to the inverted signal of the first voltage signal $v_1$.

The fourth input terminal 4 is fed with a fourth voltage signal $(-v_2)$ which is equivalent to the inverted signal of the second voltage signal $v_2$.

The fifth input terminal 5 is fed with the first voltage signal $v_1$.

The sixth input terminal 6 is fed with the fourth voltage signal $(-v_2)$.

The seventh input terminal 7 is fed with the second voltage signal $v_2$.

The mixer circuit 100 further includes a first resistor circuit 8, a second resistor circuit 9, a first output terminal 10, and a second output terminal 11.

The first resistor circuit 8 has one end connected to a power supply potential Vdd which is the first potential. The first resistor circuit 8 has a resistance value R. The first resistor circuit 8 is, for example, a load resistor and includes a transistor, an inductor, and a parasitic resistor such as wiring.

The second resistor circuit 9 has one end connected to the power supply potential Vdd which is the first potential. The second resistor circuit 9 has the same resistance value R as the first resistor circuit 8. The second resistor circuit 9 is, for example, a load resistor and includes a transistor, an inductor, and a parasitic resistor such as wiring.

The first output terminal 10 is connected to the other end of the first resistor circuit 8. The first resistor circuit 8 is fed with an output current Ip, so that an output voltage Voutp is outputted from the first output terminal 10.

The second output terminal 11 is connected to the other end of the second resistor circuit 9. The second resistor circuit 9 is fed with an output current In, so that an output voltage Voutn is outputted from the second output terminal 11.

The mixer circuit 100 further includes a first transistor 12, a first capacitor 13, a second capacitor 14, a second transistor 15, a third capacitor 16, and a fourth capacitor 17.

The first transistor 12, which is an n-type MOS transistor, is connected between the other end of the first resistor circuit 8 and the ground potential which is the second potential.

The first capacitor 13 is connected between the first input terminal 1 and the gate of the first transistor 12. The gate is the control electrode of the first transistor 12. The first capacitor 13 has a capacitance value C1.

The second capacitor 14 is connected between the second input terminal 2 and the gate of the first transistor 12. The second capacitor 14 has a capacitance value C2.

The second transistor 15 is connected in parallel with the first transistor 12 between the other end of the first resistor circuit 8 and the ground potential. The second transistor 15 is an n-type MOS transistor of the same conductivity type as the first transistor 12.

The third capacitor 16 is connected between the third input terminal 3 and the gate of the second transistor 15. The third capacitor 16 has the same capacitance value C1 as the first capacitor 13.

The fourth capacitor 17 is connected between the fourth input terminal 4 and the gate of the second transistor 15. The fourth capacitor 17 has the same capacitance value C2 as the second capacitor 14.

The mixer circuit 100 further includes a third transistor 18, a fifth capacitor 19, a sixth capacitor 20, a fourth transistor 21, a seventh capacitor 22, and an eighth capacitor 23.

The third transistor 18 is connected between the other end of the second resistor circuit 9 and the ground potential. The third transistor 18 is an n-type MOS transistor of the same conductivity type as the first transistor 12.

The fifth capacitor 19 is connected between the fifth input terminal 5 and the gate of the third transistor 18. The fifth capacitor 19 has the same capacitance value C1 as the first capacitor 13.

The sixth capacitor 20 is connected between the sixth input terminal 6 and the gate of the third transistor 18. The sixth capacitor 20 has the same capacitance value C2 as the second capacitor 14.

The fourth transistor 21 is connected in parallel with the third transistor 18 between the other end of the second resistor circuit 9 and the ground potential. The fourth transistor 21 is an n-type MOS transistor of the same conductivity type as the first transistor 12.

The seventh capacitor 22 is connected between the third input terminal 3 and the gate of the fourth transistor 21. The seventh capacitor 22 has the same capacitance value C1 as the first capacitor 13.

The eighth capacitor 23 is connected between the seventh input terminal 7 and the gate of the fourth transistor 21. The eighth capacitor 23 has the same capacitance value C2 as the second capacitor 14.

The mixer circuit 100 further includes a current source 24 connected between the sources of the first to fourth transistors 12, 15, 18, and 21 and the ground potential. The current source 24 outputs a current $I_{BIAS}$.

The following will describe the operations of the mixer circuit 100 configured thus.

The mixer circuit 100 differentially operates the first and second MOS transistors 12 and 15 based on a voltage Vpp obtained by capacitively coupling the first input signal $v_1$ and the second input signal $v_2$ and a voltage Vnn obtained by capacitively coupling the third input signal $(-v_1)$ and the fourth input signal $(-v_2)$. That is, it seems that a adder is made up of the first capacitor 13 and the second capacitor 14 and has two input and one output, or the adder outputs the voltage Vpp by adding the first input signal ($v_1$) and the second input signal ($v_2$). In the same way, it seems that a adder is made up of the third capacitor 16 and the fourth capacitor 17 and has two input and one output, or the adder outputs the voltage Vpp by adding the third input signal $(-v_1)$ and the fourth input signal $(-v_2)$.

The output current Ip fluctuates according to the operations of the first and second MOS transistors 12 and 15. That is, it seems that a current (source/drain current) is outputted from the first MOS transistor (square circuit) 12 based on the voltage Vpp, a current (source/drain current) is outputted from the second MOS transistor (square circuit) 15 based on the voltage Vnn, and the output current Ip is obtained by adding the currents (source/drain currents).

As has been discussed, the output voltage Voutp corresponding to a voltage drop in the first resistor circuit 8 is outputted from the first output terminal 10.

Similarly, the mixer circuit 100 differentially operates the third and fourth MOS transistors 18 and 21 based on a voltage Vpn obtained by capacitively coupling the first input signal $v_1$ and the fourth input signal $(-v_2)$ and a voltage Vnp obtained by capacitively coupling the third input signal $(-v_1)$ and the second input signal $v_2$. That is, it seems that a adder is made up of the seventh capacitor 22 and the eighth capacitor 23 and has two input and one output, or the adder outputs the voltage Vnp by adding the third input signal $(-v_1)$ and the second input signal ($v_2$). In the same way, it seems that a adder is made up of the fifth capacitor 19 and the sixth capacitor 20 and has two input and one output, or the adder outputs the voltage Vpn by adding the first input signal ($v_1$) and the fourth input signal $(-v_2)$.

The output current In fluctuates according to the operations of the third and fourth MOS transistors 18 and 21. That is, it seems that a current (source/drain current) is outputted from the third MOS transistor (square circuit) 18 based on the voltage Vpn, a current (source/drain current) is outputted from the fourth MOS transistor (square circuit) 21 based on the voltage Vnp, and the output current In is obtained by adding the currents (source/drain currents).

As has been discussed, the output voltage Voutn corresponding to a voltage drop in the second resistor circuit 9 is outputted from the second output terminal 11.

As described above, the mixer circuit 100 outputs the output voltages in response to the first to fourth input signals.

As has been discussed, the mixer circuit 100 adds the analog signals, which are inputted to the input terminals, by capacitive coupling. The following will describe the principle of the addition of the analog signals by capacitive coupling.

First, according to Kirchhoff's law, voltages are determined on nodes connected to the gates of the MOS transistors of the mixer circuit 100 shown in FIG. 1. Voltages "$v_{pp}$", "$v_{nn}$", "$v_{pn}$", and "$v_{np}$" on the nodes are expressed by formulas (5) to (8) as below.

$$v_{pp} = \frac{C_1}{C_1+C_2}v_1 + \frac{C_2}{C_1+C_2}v_2 \quad (5)$$

$$v_{nn} = -\frac{C_1}{C_1+C_2}v_1 - \frac{C_2}{C_1+C_2}v_2 \quad (6)$$

$$v_{np} = -\frac{C_1}{C_1+C_2}v_1 + \frac{C_2}{C_1+C_2}v_2 \quad (7)$$

$$v_{pn} = \frac{C_1}{C_1+C_2}v_1 - \frac{C_2}{C_1+C_2}v_2 \quad (8)$$

As is understood from formulas (5) to (8), the analog signals can be added by capacitive coupling.

For example, it is assumed that the MOS transistors of the mixer circuit 100 in FIG. 1 are operated in a saturated region. In this case, a difference "$I_p-I_n$" between the output currents of the mixer circuit is expressed by formulas (9) to (11). "$\beta_n$" represents the same value as in formula (2).

$$I_p - I_n = 4\beta_n a_1 a_2 v_1 v_2 \quad (9)$$

$$a_1 = \frac{C_1}{C_1+C_2} \quad (10)$$

$$a_2 = \frac{C_2}{C_1+C_2} \quad (11)$$

As expressed in formulas (9) to (11), the circuit configuration of the mixer circuit 100 makes it possible to multiply the input signals $v_1$ and $v_2$ by determining a difference in output current.

Further, the voltages are outputted through the resistor circuits, so that a difference "$V_{outp}-V_{outn}$" between the output voltages is expressed by formula (12).

$$V_{outp}-V_{outn}=-4R\beta_n a_1 a_2 v_1 v_2 \quad (12)$$

As expressed in formula (12), the circuit configuration of the mixer circuit 100 makes it possible to multiply the input signals $v_1$ and $v_2$ also by determining a difference between the output voltages.

As described above, the mixer circuit of the first embodiment can eliminate the need for an adding circuit of analog signals unlike the prior art in which power is consumed because of the DC bias currents of transistors. Thus the mixer circuit of the first embodiment can operate with lower power than in the prior art.

As described above, the mixer circuit of the present embodiment can perform low-voltage operations with lower power.

Second Embodiment

The first embodiment described an example of the configuration of the mixer circuit.

The mixer circuit of the first embodiment can achieve the same effect even when the polarity of the circuit is inverted.

The present embodiment will describe a structural example of a mixer circuit whose polarity is inverted from the circuit of the first embodiment.

As described above, the polarity of the circuit is inverted in the present embodiment, so that a first potential is a ground potential and a second potential is a power supply potential. Moreover, MOS transistors are p-type MOS transistors. The control electrodes of the transistors correspond to the gate electrodes of the MOS transistors.

As in the first embodiment, a DC voltage is biased to the gates of the MOS transistors but is canceled in the examination of output characteristics. Thus a direct current is not considered in the present embodiment.

Figure 2:
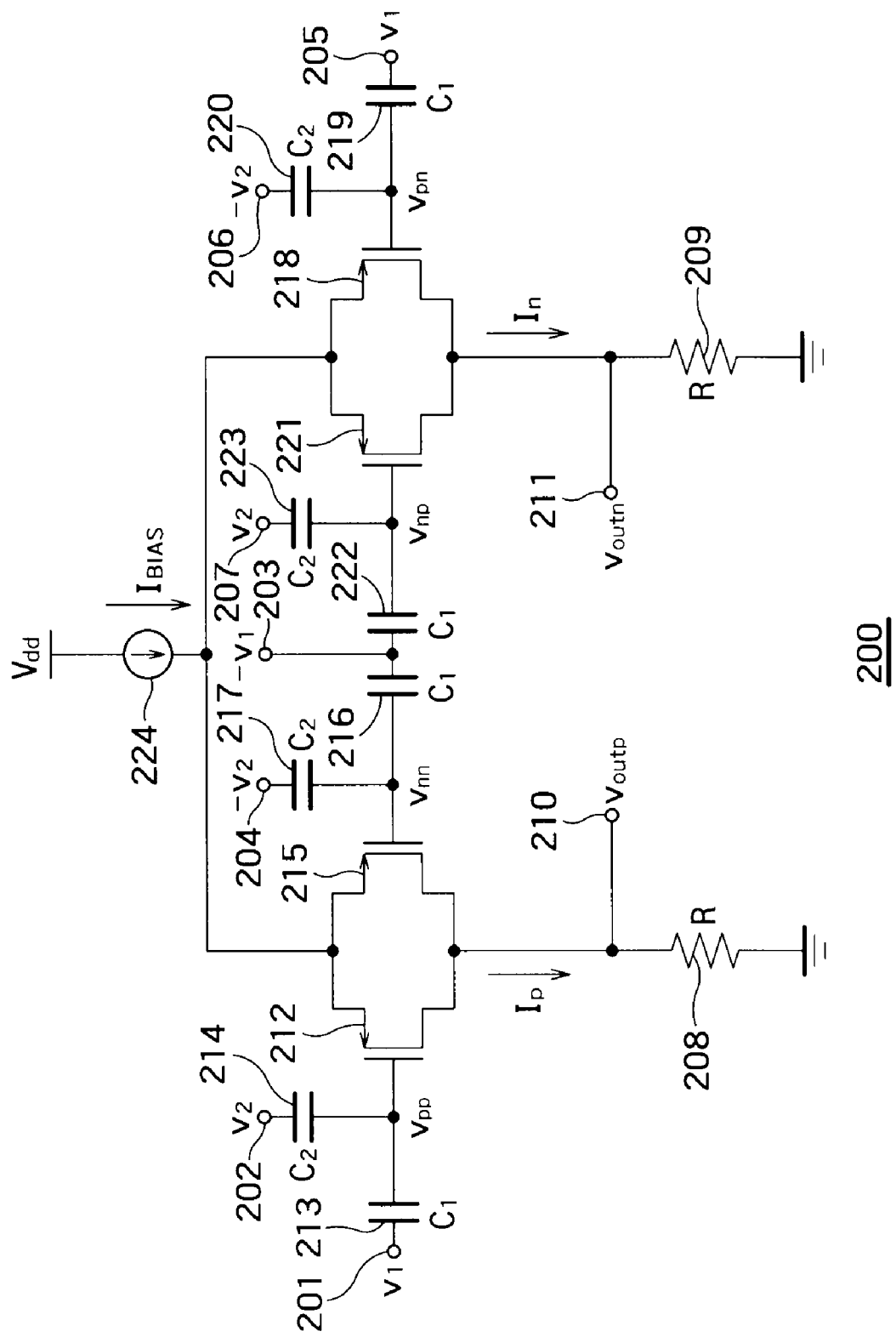
FIG. 2 is a circuit diagram showing the main configuration of the mixer circuit according to a second embodiment which is an aspect of the present invention. Configurations indicated by the same reference numerals as the first embodiment are the same configurations as the first embodiment.

FIG. 2 is a circuit diagram showing the main configuration of the mixer circuit according to a second embodiment which is an aspect of the present invention. Configurations indicated by the same reference numerals as the first embodiment are the same configurations as the first embodiment.

As shown in FIG. 2, a mixer circuit 200 includes a first input terminal 201, a second input terminal 202, a third input terminal 203, a fourth input terminal 204, a fifth input terminal 205, a sixth input terminal 206, and a seventh input terminal 207.

The first input terminal 201 is fed with a first voltage signal $v_1$ which is an analog signal.

The second input terminal 202 is fed with a second voltage signal $v_2$ which is an analog signal.

The third input terminal 203 is fed with a third voltage signal ($-v_1$) which is equivalent to the inverted signal of the first voltage signal $v_1$.

The fourth input terminal 204 is fed with a fourth voltage signal ($-v_2$) which is equivalent to the inverted signal of the second voltage signal $v_2$.

The fifth input terminal 205 is fed with the first voltage signal $v_1$.

The sixth input terminal 206 is fed with the fourth voltage signal ($-v_2$).

The seventh input terminal 207 is fed with the second voltage signal $v_2$.

The mixer circuit 200 further includes a first resistor circuit 208, a second resistor circuit 209, a first output terminal 210, and a second output terminal 211.

The first resistor circuit 208 has one end connected to the ground potential which is the first potential. The first resistor circuit 208 has a resistance value R. The first resistor circuit 208 is, for example, a load resistor.

The second resistor circuit 209 has one end connected to the ground potential which is the first potential. The second resistor circuit 209 has the same resistance value R as the first resistor circuit 208. The second resistor circuit 209 is, for example, a load resistor.

The first output terminal 210 is connected to the other end of the first resistor circuit 208. The first resistor circuit 208 is fed with an output current Ip, so that an output voltage Voutp is outputted from the first output terminal 210.

The second output terminal 211 is connected to the other end of the second resistor circuit 209. The second resistor circuit 209 is fed with an output current In, so that an output voltage Voutn is outputted from the second output terminal 211.

The mixer circuit 200 further includes a first transistor 212, a first capacitor 213, a second capacitor 214, a second transistor 215, a third capacitor 216, and a fourth capacitor 217.

The first transistor 212, which is a p-type MOS transistor, is connected between the other end of the first resistor circuit 208 and a power supply potential Vdd which is the second potential.

The first capacitor 213 is connected between the first input terminal 201 and the gate of the first transistor 212. The gate is the control electrode of the first transistor 212. The first capacitor 213 has a capacitance value C1.

The second capacitor 214 is connected between the second input terminal 202 and the gate of the first transistor 212. The second capacitor 214 has a capacitance value C2.

The second transistor 215 is connected in parallel with the first transistor 212 between the other end of the first resistor circuit 208 and the power supply potential Vdd. The second transistor 215 is a p-type MOS transistor of the same conductivity type as the first transistor 212.

The third capacitor 216 is connected between the third input terminal 203 and the gate of the second transistor 215. The third capacitor 216 has the same capacitance value C1 as the first capacitor 213.

The fourth capacitor 217 is connected between the fourth input terminal 204 and the gate of the second transistor 215. The fourth capacitor 217 has the same capacitance value C2 as the second capacitor 214.

The mixer circuit 200 further includes a third transistor 218, a fifth capacitor 219, a sixth capacitor 220, a fourth transistor 221, a seventh capacitor 222, and an eighth capacitor 223.

The third transistor 218 is connected between the other end of the second resistor circuit 209 and the power supply potential Vdd. The third transistor 218 is a p-type MOS transistor of the same conductivity type as the first transistor 212.

The fifth capacitor 219 is connected between the fifth input terminal 205 and the gate of the third transistor 218. The fifth capacitor 219 has the same capacitance value C1 as the first capacitor 213.

The sixth capacitor 220 is connected between the sixth input terminal 206 and the gate of the third transistor 218. The sixth capacitor 220 has the same capacitance value C2 as the second capacitor 214.

The fourth transistor 221 is connected in parallel with the third transistor 218 between the other end of the second resistor circuit 209 and the power supply potential Vdd. The fourth transistor 221 is a p-type MOS transistor of the same conductivity type as the first transistor 212.

The seventh capacitor 222 is connected between the third input terminal 203 and the gate of the fourth transistor 221. The seventh capacitor 222 has the same capacitance value C1 as the first capacitor 213.

The eighth capacitor 223 is connected between the seventh input terminal 207 and the gate of the fourth transistor 221. The eighth capacitor 223 has the same capacitance value C2 as the second capacitor 214.

The mixer circuit 200 further includes a current source 224 connected between the sources of the first to fourth transistors 212, 215, 218, and 221 and the power supply potential Vdd. The current source 224 outputs a current $I_{BIAS}$.

The operations of the mixer circuit 200 configured thus are similar to the operations of the mixer circuit 100 described in the first embodiment.

In other words, the mixer circuit 200 outputs the output voltages in response to the first to fourth input signals.

Further, as in the first embodiment, the mixer circuit 200 adds the analog signals, which are inputted to the input terminals, by capacitive coupling.

Thus as in the first embodiment, the mixer circuit of the second embodiment can eliminate the need for an adding circuit of analog signals unlike the prior art in which power is consumed because of the DC bias currents of transistors. Hence the mixer circuit of the second embodiment can operate with lower power than in the prior art.

As described above, the mixer circuit of the present embodiment can perform low-voltage operations with lower power.

Third Embodiment

The first and second embodiments described examples of the configuration of the mixer circuit.

In the first and second embodiments, for example, resistance loads are used as the first and second resistor circuits of the mixer circuits. Transistors may be used as the first and second resistor circuits.

The present embodiment will describe a structural example of a mixer circuit using transistors as first and second resistor circuits. In this example, transistors are used as the first and second resistor circuits of the mixer circuit described in the first embodiment.

As in the first embodiment, a DC voltage is biased to the gates of the MOS transistors but is canceled in the examination of output characteristics. Thus a direct current is not considered in the present embodiment.

Figure 3:
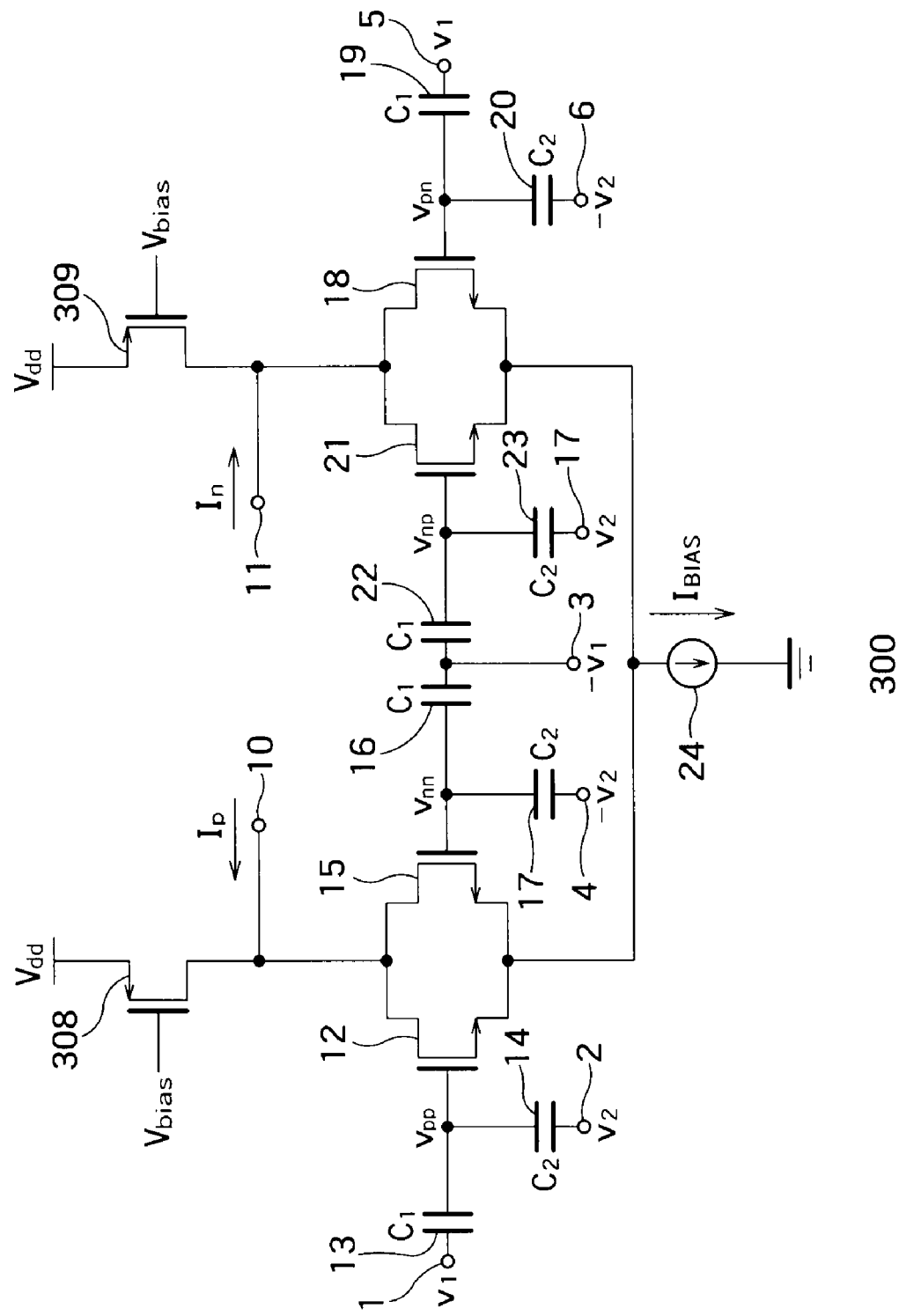
FIG. 3 is a circuit diagram showing the main configuration of the mixer circuit according to a third embodiment which is an aspect of the present invention.

FIG. 3 is a circuit diagram showing the main configuration of the mixer circuit according to a third embodiment which is an aspect of the present invention. Configurations indicated by the same reference numerals as the first embodiment are the same configurations as the first embodiment.

As shown in FIG. 3, the first and second resistor circuits of a mixer circuit 300 are made up of p-type MOS transistors 308 and 309, each having a control electrode (gate) connected to a fixed potential Vbias. The p-type MOS transistors 308 and 309 also act as current sources.

In the configuration of the mixer circuit 300, when it is assumed that the p-type MOS transistors 308 and 309 have infinite output impedances, first and second output terminals 10 and 11 output currents. In this assumption, a difference "$I_p - I_n$" between output currents Ip and In is expressed as formula (9).

Further, voltages can be outputted by disposing a current/voltage converting circuit downstream of the mixer circuit 300.

The mixer circuit 300 configured thus outputs the output voltages in response to first to fourth input signals as in the first embodiment.

Further, as in the first embodiment, the mixer circuit 300 adds analog signals, which are inputted to the input terminals, by capacitive coupling.

Thus as in the first embodiment, the mixer circuit of the third embodiment can eliminate the need for an adding circuit of analog signals unlike the prior art in which power is consumed because of the DC bias currents of transistors. Hence the mixer circuit of the third embodiment can operate with lower power than in the prior art.

As described above, the mixer circuit of the present embodiment can perform low-voltage operations with lower power.

Fourth Embodiment

The first and second embodiments described examples of the configuration of the mixer circuit.

The present embodiment will describe a structural example of a mixer circuit for further improving characteristics. In this example, transistors are used as the first and second resistor circuits of the mixer circuit of the first embodiment.

As in the first embodiment, a DC voltage is biased to the gates of the MOS transistors but is canceled in the examination of output characteristics. Thus a direct current is not considered in the present embodiment.

Figure 4:
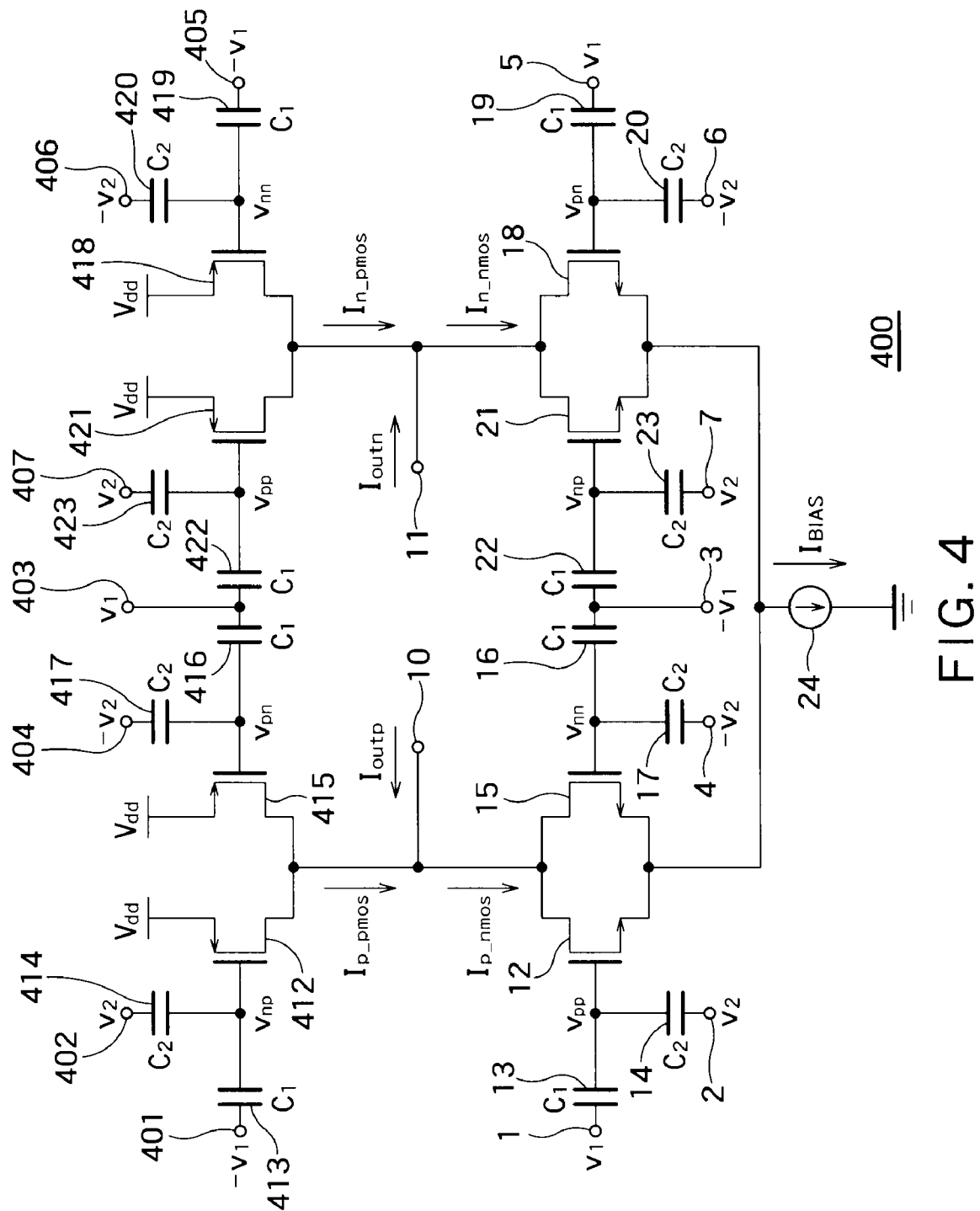
FIG. 4 is a circuit diagram showing the main configuration of the mixer circuit according to a fourth embodiment which is an aspect of the present invention.

FIG. 4 is a circuit diagram showing the main configuration of the mixer circuit according to a fourth embodiment which is an aspect of the present invention. Configurations indicated by the same reference numerals as the first and second embodiments are the same configurations as the first and second embodiments.

As shown in FIG. 4, a mixer circuit 400 includes a first input terminal 1, a second input terminal 2, a third input terminal 3, a fourth input terminal 4, a fifth input terminal 5, a sixth input terminal 6, and a seventh input terminal 7.

The first input terminal 1 is fed with a first voltage signal $v_1$ which is an analog signal.

The second input terminal 2 is fed with a second voltage signal $v_2$ which is an analog signal.

The third input terminal 3 is fed with a third voltage signal $(-v_1)$ which is equivalent to the inverted signal of the first voltage signal $v_1$.

The fourth input terminal 4 is fed with a fourth voltage signal $(-v_2)$ which is equivalent to the inverted signal of the second voltage signal $v_2$.

The fifth input terminal 5 is fed with the first voltage signal $v_1$.

The sixth input terminal 6 is fed with the fourth voltage signal $(-v_2)$.

The seventh input terminal 7 is fed with the second voltage signal $v_2$.

The mixer circuit 400 further includes a first output terminal 10 and a second output terminal 11.

The first output terminal 10 outputs an output current Ioutp. The second output terminal 11 outputs an output current Ioutn.

The mixer circuit 400 further includes a first transistor 12, a first capacitor 13, a second capacitor 14, a second transistor 15, a third capacitor 16, and a fourth capacitor 17.

The first transistor 12, which is an n-type MOS transistor, is connected between the first output terminal 10 and a ground potential which is a second potential.

The first capacitor 13 is connected between the first input terminal 1 and the gate of the first transistor 12. The gate is the control electrode of the first transistor 12. The first capacitor 13 has a capacitance value C1.

The second capacitor 14 is connected between the second input terminal 2 and the gate of the first transistor 12. The second capacitor 14 has a capacitance value C2.

The second transistor 15 is connected in parallel with the first transistor 12 between the first output terminal 10 and the ground potential. The second transistor 15 is an n-type MOS transistor of the same conductivity type as the first transistor 12.

The third capacitor 16 is connected between the third input terminal 3 and the gate of the second transistor 15. The third capacitor 16 has the same capacitance value C1 as the first capacitor 13.

The fourth capacitor 17 is connected between the fourth input terminal 4 and the gate of the second transistor 15. The fourth capacitor 17 has the same capacitance value C2 as the second capacitor 14.

The mixer circuit 400 further includes a third transistor 18, a fifth capacitor 19, a sixth capacitor 20, a fourth transistor 21, a seventh capacitor 22, and an eighth capacitor 23.

The third transistor 18 is connected between the second output terminal 11 and the ground potential. The third transistor 18 is an n-type MOS transistor of the same conductivity type as the first transistor 12.

The fifth capacitor 19 is connected between the fifth input terminal 5 and the gate of the third transistor 18. The fifth capacitor 19 has the same capacitance value C1 as the first capacitor 13.

The sixth capacitor 20 is connected between the sixth input terminal 6 and the gate of the third transistor 18. The sixth capacitor 20 has the same capacitance value C2 as the second capacitor 14.

The fourth transistor 21 is connected in parallel with the third transistor 18 between the second output terminal 11 and the ground potential. The fourth transistor 21 is an n-type MOS transistor of the same conductivity type as the first transistor 12.

The seventh capacitor 22 is connected between the third input terminal 3 and the gate of the fourth transistor 21. The seventh capacitor 22 has the same capacitance value C1 as the first capacitor 13.

The eighth capacitor 23 is connected between the seventh input terminal 7 and the gate of the fourth transistor 21. The eighth capacitor 23 has the same capacitance value C2 as the second capacitor 14.

The mixer circuit 400 further includes a current source 24 connected between the sources of the first to fourth transistors 12, 15, 18, and 21 and the ground potential. The current source 24 outputs a current $I_{BIAS}$.

The mixer circuit 400 further includes an eighth input terminal 401, a ninth input terminal 402, a tenth input terminal 403, an eleventh input terminal 404, a twelfth input terminal 405, a thirteenth input terminal 406, and a fourteenth input terminal 407.

The eighth input terminal 401 is fed with the third voltage signal $(-v_1)$.

The ninth input terminal 402 is fed with the second voltage signal $v_2$.

The tenth input terminal 403 is fed with the first voltage signal $v_1$.

The eleventh input terminal 404 is fed with the fourth voltage signal $(-v_2)$.

The twelfth input terminal 405 is fed with third voltage signal $(-v_1)$.

The thirteenth input terminal 406 is fed with the fourth voltage signal $(-v_2)$.

The fourteenth input terminal 407 is fed with the second voltage signal $v_2$.

The mixer circuit 400 further includes a fifth transistor 412, a ninth capacitor 413, a tenth capacitor 414, a sixth transistor 415, an eleventh capacitor 416, and a twelfth capacitor 417.

The fifth transistor 412, which is a p-type MOS transistor, is connected between the first output terminal 10 and a power supply potential Vdd which is a first potential.

The ninth capacitor 413 is connected between the first input terminal 401 and the gate of the fifth transistor 412. The gate is the control electrode of the fifth transistor 412. The ninth capacitor 413 has the capacitance value C1.

The tenth capacitor 414 is connected between the second input terminal 402 and the gate of the fifth transistor 412. The tenth capacitor 414 has the capacitance value C2.

The sixth transistor 415 is connected in parallel with the fifth transistor 412 between the first output terminal 10 and the power supply potential Vdd. The sixth transistor 415 is a p-type MOS transistor of the same conductivity type as the fifth transistor 412.

The eleventh capacitor 416 is connected between the tenth input terminal 403 and the gate of the sixth transistor 415. The eleventh capacitor 416 has the same capacitance value C1 as the ninth capacitor 413.

The twelfth capacitor 417 is connected between the eleventh input terminal 404 and the gate of the sixth transistor 415. The twelfth capacitor 417 has the same capacitance value C2 as the tenth capacitor 414.

The mixer circuit 400 further includes a seventh transistor 418, a thirteenth capacitor 419, a fourteenth capacitor 420, an eighth transistor 421, a fifteenth capacitor 422, and a sixteenth capacitor 423.

The seventh transistor 418 is connected between the second output terminal 11 and the power supply potential Vdd. The seventh transistor 418 is a p-type MOS transistor of the same conductivity type as the fifth transistor 412.

The thirteenth capacitor 419 is connected between the twelfth input terminal 405 and the gate of the seventh transistor 418. The thirteenth capacitor 419 has the same capacitance value C1 as the ninth capacitor 413.

The fourteenth capacitor 420 is connected between the thirteenth input terminal 406 and the gate of the seventh transistor 418. The fourteenth capacitor 420 has the same capacitance value C2 as the tenth capacitor 414.

The eighth transistor 421 is connected in parallel with the seventh transistor 418 between the second output terminal 11 and the power supply potential Vdd. The eighth transistor 421 is a p-type MOS transistor of the same conductivity type as the fifth transistor 412.

The fifteenth capacitor 422 is connected between the tenth input terminal 403 and the gate of the eighth transistor 421. The fifteenth capacitor 422 has the same capacitance value C1 as the ninth capacitor 413.

The sixteenth capacitor 423 is connected between the fourteenth input terminal 407 and the gate of the eighth transistor 421. The sixteenth capacitor 423 has the same capacitance value C2 as the tenth capacitor 414.

The operations of the mixer circuit 400 configured thus are similar to the operations of the mixer circuits described in the first and second embodiments.

In other words, the mixer circuit 400 outputs the output voltages in response to the first to fourth input signals.

Further, as in the first and second embodiments, the mixer circuit 400 adds the analog signals, which are inputted to the input terminals, by capacitive coupling.

The following will describe a principle for improving the characteristics of the mixer circuit 400 configured thus as compared with the mixer circuits of the first to third embodiments.

It is assumed that the transistors of the mixer circuit 400 are operated in a saturated region. Also in this case, a channel length modulation effect is ignored for simplification. To be specific, the drain currents of the n-type MOS transistors are expressed by the foregoing formula (1). The drain currents of the p-type MOS transistors are expressed by formulas (13) and (14).

$$I_{dsp} = -\frac{1}{2}\beta_p(|V_{gs}| - |V_{thp}|)^2 \quad (13)$$

$$\beta_p = \mu_p C_{ox}\frac{W_p}{L_p} \quad (14)$$

where "$\mu_p$" is the mobility of holes, "$C_{ox}$" represents the thickness of the gate oxide film of the transistor, and "$W_p$" and "$L_p$" respectively represent the gate width and gate length of the p-type MOS transistor. Further, "$V_{gs}$" represents a gate-to-source voltage and "$V_{thp}$" represents the threshold voltage of the p-type MOS transistor.

Based on this assumption, currents "$I_{p\_NMOS}$", "$I_{n\_NMOS}$", "$I_{p\_pMOS}$", and "$I_{n\_pMOS}$" passing through the mixer circuit 400 shown in FIG. 4 are expressed by formulas (15) to (18).

$$I_{p\_nmos}=\beta_p(a_1^2v_1^2+2a_1a_2v_1v_2+a_2^2v_2^2+V_{thn}^2) \quad (15)$$

$$I_{n\_nmos}=\beta_p(a_1^2v_1^2-2a_1a_2v_1v_2+a_2^2v_2^2+V_{thn}^2) \quad (16)$$

$$I_{p\_pmos}=\beta_p(a_1^2v_1^2-2a_1a_2v_1v_2+a_2^2v_2^2+V_{dd}^2-2V_{dd}|V_{thp}|+V_{thp}^2) \quad (17)$$

$$I_{n\_pmos}=\beta_p(a_1^2v_1^2+2a_1a_2v_1v_2+a_2^2v_2^2+V_{dd}^2-2V_{dd}|V_{thp}|+V_{thp}^2) \quad (18)$$

Thus in the case of the output current $I_{outp}=I_{p\_pmos}-I_{p\_nmos}$ and the output current $I_{outn}=I_{n\_nmos}-I_{n\_pmos}$, a difference "$I_{outp}-I_{outn}$" between the output currents is expressed by formula (19).

$$I_{outp}-I_{outn}=4(\beta_n+\beta_p)a_1a_2v_1v_2 \quad (19)$$

As is understood from formula (19), when the mixer circuit is designed so as to have $\beta_n=\beta_p$, the mixer circuit of the present embodiment can obtain an output current twice as large as the mixer circuits of the first to third embodiments. Further, voltages can be outputted by disposing a current/voltage converting circuit downstream of the mixer circuit.

Thus as in the first and second embodiments, the mixer circuit of the fourth embodiment can eliminate the need for an adding circuit of analog signals unlike the prior art in which power is consumed because of the DC bias currents of transistors. Hence the mixer circuit of the fourth embodiment can operate with lower power than in the prior art.

As described above, the mixer circuit of the present embodiment can perform low-voltage operations with lower power.

Fifth Embodiment

The first to fourth embodiments described examples of the configuration of the mixer circuit which can be reduced in voltage and power.

In the foregoing mixer circuits, capacitive coupling is used on signal input points to the mixer circuits. Thus it is assumed in the embodiments that two of the input signals to the mixer circuit are high frequency signals.

In other words, it is assumed in the first to fourth embodiments that the mixer circuit is used in a radio frequency integrated circuit (RFIC) receiving system for down converting a high frequency signal to a baseband signal.

It is therefore difficult to use the mixer circuits of the first to fourth embodiments as they are in transmitting systems.

The present embodiment will describe a structural example of a mixer circuit which is used for an RFIC transmitting system and can operate with low voltage and low power.

In the present embodiment, capacitive coupling on one of the signal input points is replaced with direct current (DC) coupling without changing the basic configurations of the transistors in the mixer circuit of the first embodiment. Thus the mixer circuit can be used for an RFIC transmitting system.

As in the first embodiment, a DC voltage is biased to the gates of the MOS transistors.

Figure 5:
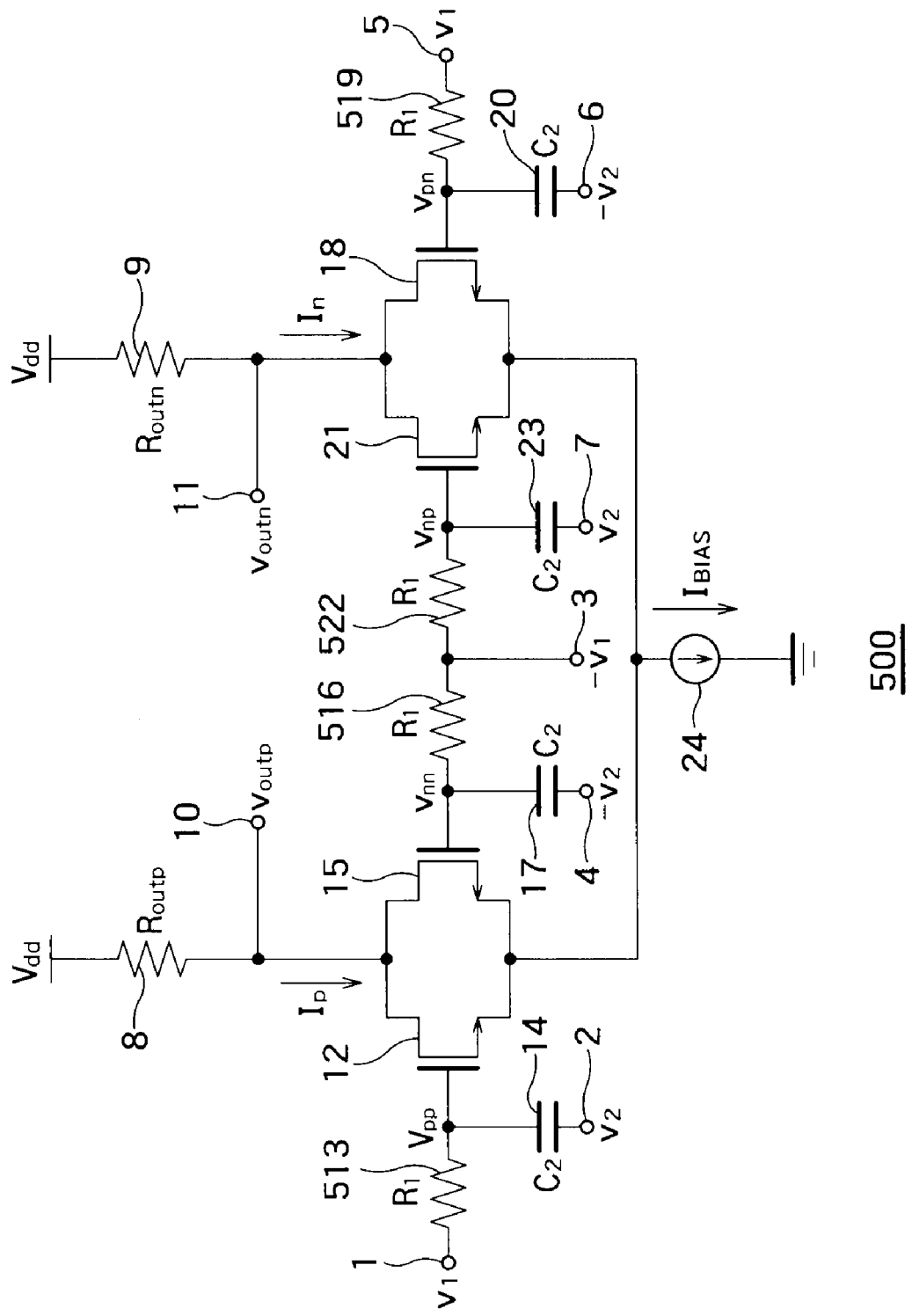
FIG. 5 is a circuit diagram showing the main configuration of the mixer circuit according to a fifth embodiment which is an aspect of the present invention.

FIG. 5 is a circuit diagram showing the main configuration of the mixer circuit according to a fifth embodiment which is an aspect of the present invention. Configurations indicated by the same reference numerals as the first embodiment are the same configurations as the first embodiment.

As shown in FIG. 5, in a mixer circuit 500, the first capacitor 13 of the mixer circuit 100 described in the first embodiment is replaced with a first resistance element 513. The third capacitor 16 of the mixer circuit 100 is similarly replaced with a second resistance element 516. The fifth capacitor 19 of the mixer circuit 100 is similarly replaced with a third resistance element 519. The seventh capacitor 22 of the mixer circuit 100 is similarly replaced with a fourth resistance element 522.

In the present embodiment (also in the following embodiments), a first voltage signal $v_1$ is a baseband signal having a frequency of, for example, about 20 MHz to 30 MHz. A second voltage signal $v_2$ is a high frequency signal having a frequency of, for example, about 400 MHz to several GHz.

Other configurations of the mixer circuit 500 are similar to the configurations of the mixer circuit 100 described in the first embodiment.

The operations of the mixer circuit 500 configured thus are similar to the operations of the mixer circuit 100 described in the first embodiment. Thus the mixer circuit 500 outputs output voltages in response to first to fourth input signals.

As described above, the mixer circuit 500 adds analog signals, which are inputted to input terminals, by capacitive coupling and DC coupling. The following will describe a principle of the addition of the analog signals by capacitive coupling and DC coupling.

First, according to Kirchhoff's law, voltages are determined on nodes connected to the gates of MOS transistors of the mixer circuit 500 shown in FIG. 5. Voltages "$v_{pp}$", "$v_{nn}$", "$v_{pn}$", and "$v_{np}$" on the nodes are expressed by formulas (20) to (23) as follows:

$$v_{pp} = \frac{1}{1 + j\omega R_1 C_1}(v_1 + j\omega R_1 C_1 v_2) \quad (20)$$

$$v_{nn} = \frac{1}{1 + j\omega R_1 C_1}(-v_1 - j\omega R_1 C_1 v_2) \quad (21)$$

$$v_{np} = \frac{1}{1 + j\omega R_1 C_1}(-v_1 + j\omega R_1 C_1 v_2) \quad (22)$$

$$v_{pn} = \frac{1}{1 + j\omega R_1 C_1}(v_1 - j\omega R_1 C_1 v_2) \quad (23)$$

As expressed in formulas (20) to (23), the analog signals can be added by capacitive coupling and DC coupling. As in the first embodiment, based on the square-law characteristics of the saturated drain current of the MOS transistor, the input signals $v_1$ and $v_2$ can be multiplied by determining a difference "$I_p - I_n$" between the output currents. In other words, the functions of the mixer can be achieved as in the first embodiment.

As shown in FIG. 5, the first input signal $v_1$ is inputted to the gate terminal of the transistor through DC coupling, and the second input signal $v_2$ is inputted to the gate terminal of the transistor through capacitive coupling. Further, as has been discussed, it is assumed that the first input signal $v_1$ is a baseband signal and the second input signal $v_2$ is a high frequency signal. Thus the mixer circuit 500 can be used as the mixer of an RFIC transmitting system.

Moreover, the basic configurations of the transistors in the mixer circuit 500 are similar to the configurations of the transistors of the first embodiment, so that the mixer circuit 500 can operate with low voltage and low power.

As described above, the mixer circuit of the present embodiment can perform low-voltage operations with lower power.

Sixth Embodiment

The fifth embodiment described an example in which the configuration of the mixer circuit of the first embodiment used for an RFIC receiving system is changed to be used for an RFIC transmitting system.

In the present embodiment, capacitive coupling on one of the signal input points is replaced with DC coupling without changing the basic configurations of the transistors of the mixer circuit described in the second embodiment. Thus the mixer circuit can be used for an RFIC transmitting system.

As in the fifth embodiment, a DC voltage is biased to the gates of MOS transistors.

Figure 6:
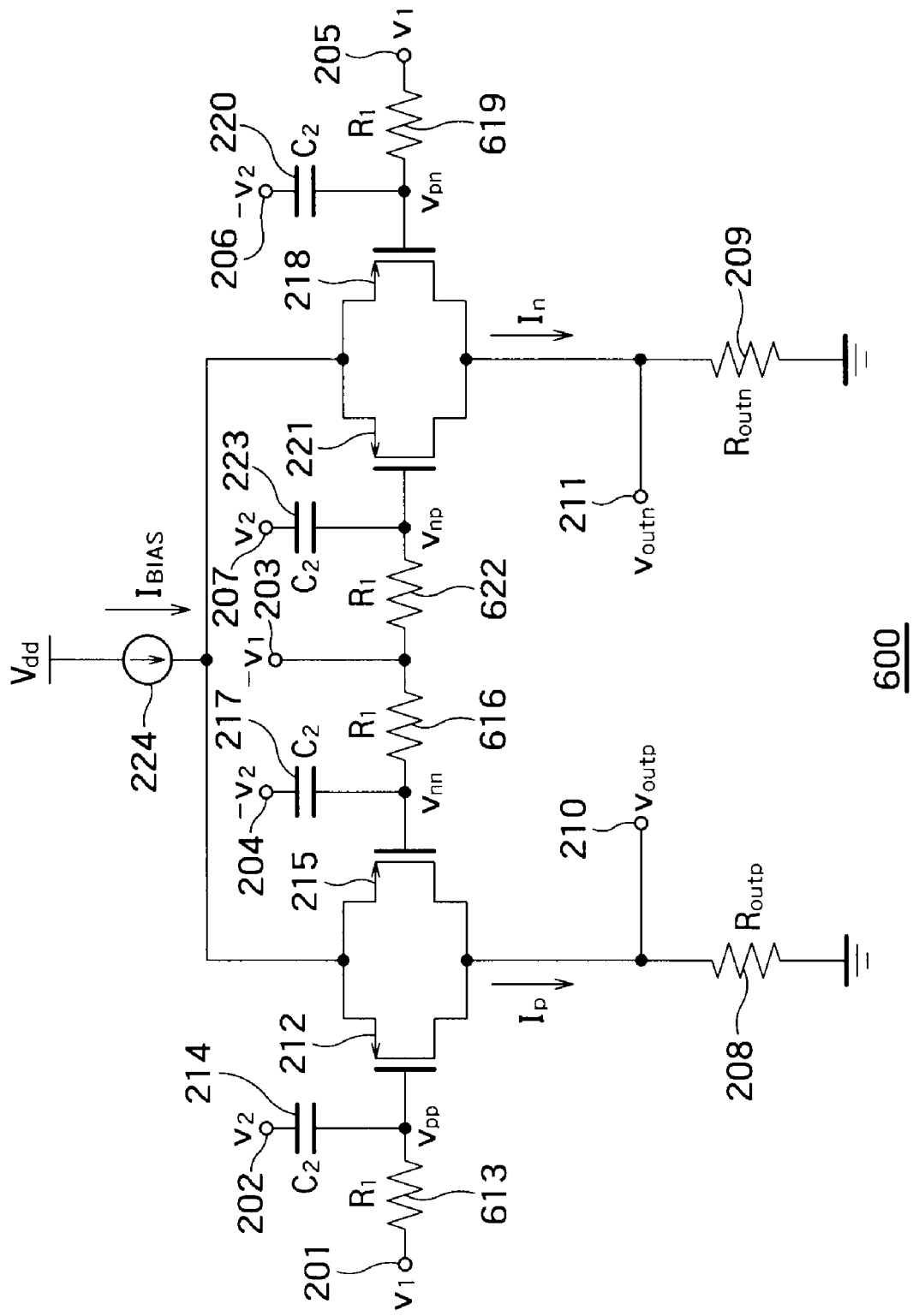
FIG. 6 is a circuit diagram showing the main configuration of the mixer circuit according to a sixth embodiment which is an aspect of the present invention.

FIG. 6 is a circuit diagram showing the main configuration of the mixer circuit according to a sixth embodiment which is an aspect of the present invention. Configurations indicated by the same reference numerals as the second embodiment are the same configurations as the second embodiment.

As shown in FIG. 6, in a mixer circuit 600, the first capacitor 213 of the mixer circuit 200 described in the second embodiment is replaced with a first resistance element 613. The third capacitor 216 of the mixer circuit 200 is similarly replaced with a second resistance element 616. The fifth capacitor 219 of the mixer circuit 200 is similarly replaced with a third resistance element 619. The seventh capacitor 222 of the mixer circuit 200 is similarly replaced with a fourth resistance element 622.

Other configurations of the mixer circuit 600 are similar to the configurations of the mixer circuit 200 described in the second embodiment.

The operations of the mixer circuit 600 configured thus are similar to the operations of the mixer circuit 200 described in the second embodiment. Thus the mixer circuit 600 outputs output voltages in response to first to fourth input signals.

As in the fifth embodiment, the mixer circuit 600 adds analog signals, which are inputted to input terminals, by capacitive coupling and DC coupling. Thus as in the fifth embodiment, the mixer circuit 600 can be used as the mixer of an RFIC transmitting system.

Moreover, the basic configurations of the transistors in the mixer circuit 600 are similar to the configurations of the transistors of the second embodiment, so that the mixer circuit 600 can operate with low voltage and low power.

As described above, the mixer circuit of the present embodiment can perform low-voltage operations with lower power as in the second embodiment.

Seventh Embodiment

The fifth embodiment described an example in which the configuration of the mixer circuit of the first embodiment used for an RFIC receiving system is changed to be used for an RFIC transmitting system.

In the present embodiment, capacitive coupling on one of the signal input points is replaced with DC coupling without changing the basic configurations of the transistors of the mixer circuit described in the third embodiment. Thus the mixer circuit can be used for an RFIC transmitting system.

As in the fifth embodiment, a DC voltage is biased to the gates of MOS transistors.

Figure 7:
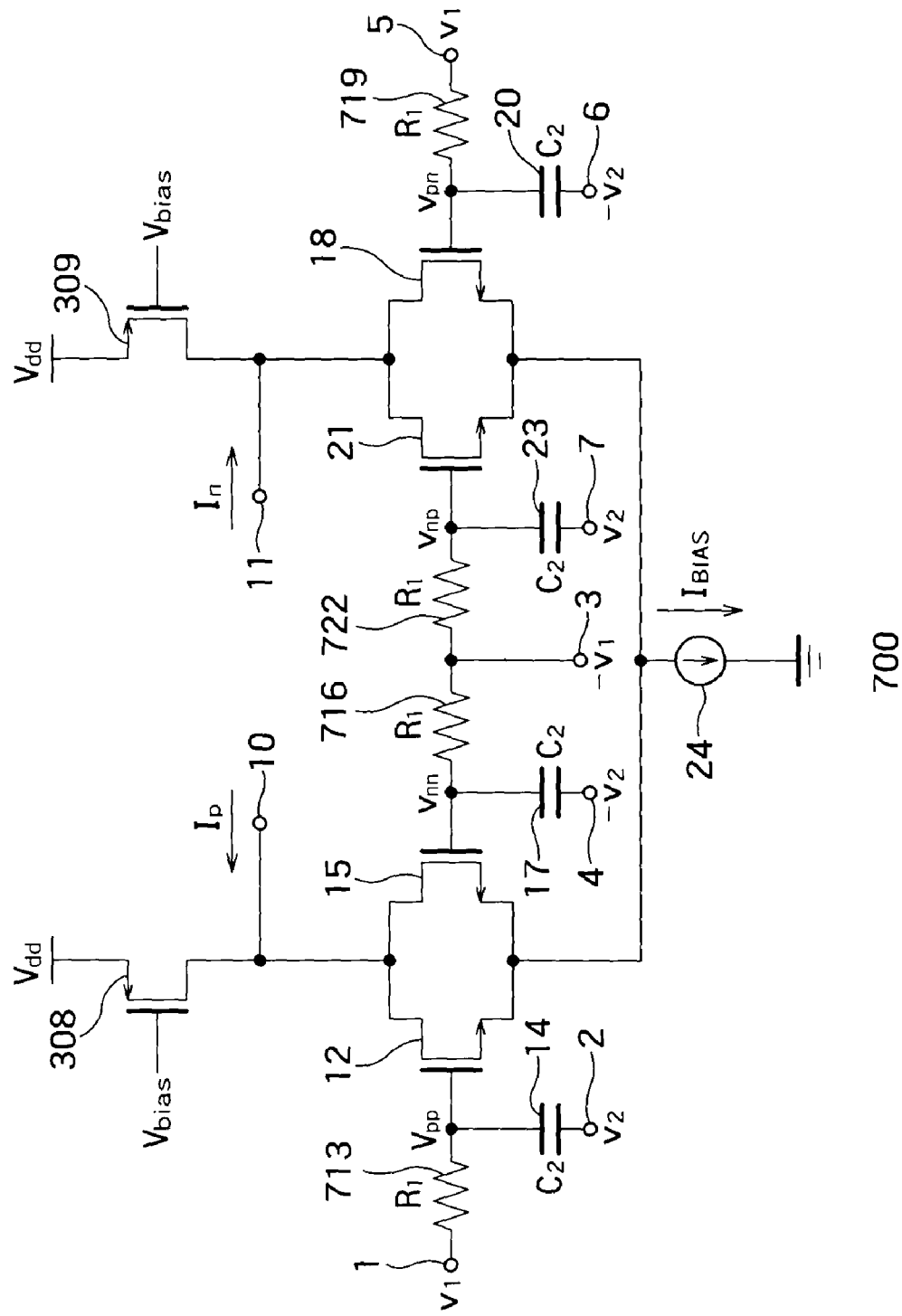
FIG. 7 is a circuit diagram showing the main configuration of the mixer circuit according to a seventh embodiment which is an aspect of the present invention.

FIG. 7 is a circuit diagram showing the main configuration of the mixer circuit according to a seventh embodiment which is an aspect of the present invention. Configurations indicated by the same reference numerals as the third embodiment are the same configurations as the third embodiment.

As shown in FIG. 7, in a mixer circuit 700, the first capacitor 13 of the mixer circuit 300 described in the third embodiment is replaced with a first resistance element 713. The third capacitor 16 of the mixer circuit 300 is similarly replaced with a second resistance element 716. The fifth capacitor 19 of the mixer circuit 300 is similarly replaced with a third resistance element 719. The seventh capacitor 22 of the mixer circuit 300 is similarly replaced with a fourth resistance element 722.

Other configurations of the mixer circuit 700 are similar to the configurations of the mixer circuit 300 described in the third embodiment.

The operations of the mixer circuit 700 configured thus are similar to the operations of the mixer circuit 300 described in the third embodiment. Thus the mixer circuit 700 outputs output voltages in response to first to fourth input signals.

As in the fifth embodiment, the mixer circuit 700 adds analog signals, which are inputted to input terminals, by capacitive coupling and DC coupling. Thus as in the fifth embodiment, the mixer circuit 700 can be used as the mixer of an RFIC transmitting system.

Moreover, the basic configurations of the transistors in the mixer circuit 700 are similar to the configurations of the transistors of the third embodiment, so that the mixer circuit 700 can operate with low voltage and low power.

As described above, the mixer circuit of the present embodiment can perform low-voltage operations with lower power as in the third embodiment.

Eighth Embodiment

The fifth to seventh embodiments described examples in which the configurations of the mixer circuits of the first to third embodiments used for an RFIC receiving system are changed to be used for an RFIC transmitting system.

In the present embodiment, capacitive coupling on one of the signal input points is replaced with DC coupling without changing the basic configurations of the transistors of the mixer circuit described in the fourth embodiment. Thus the mixer circuit can be used for an RFIC transmitting system.

Figure 8:
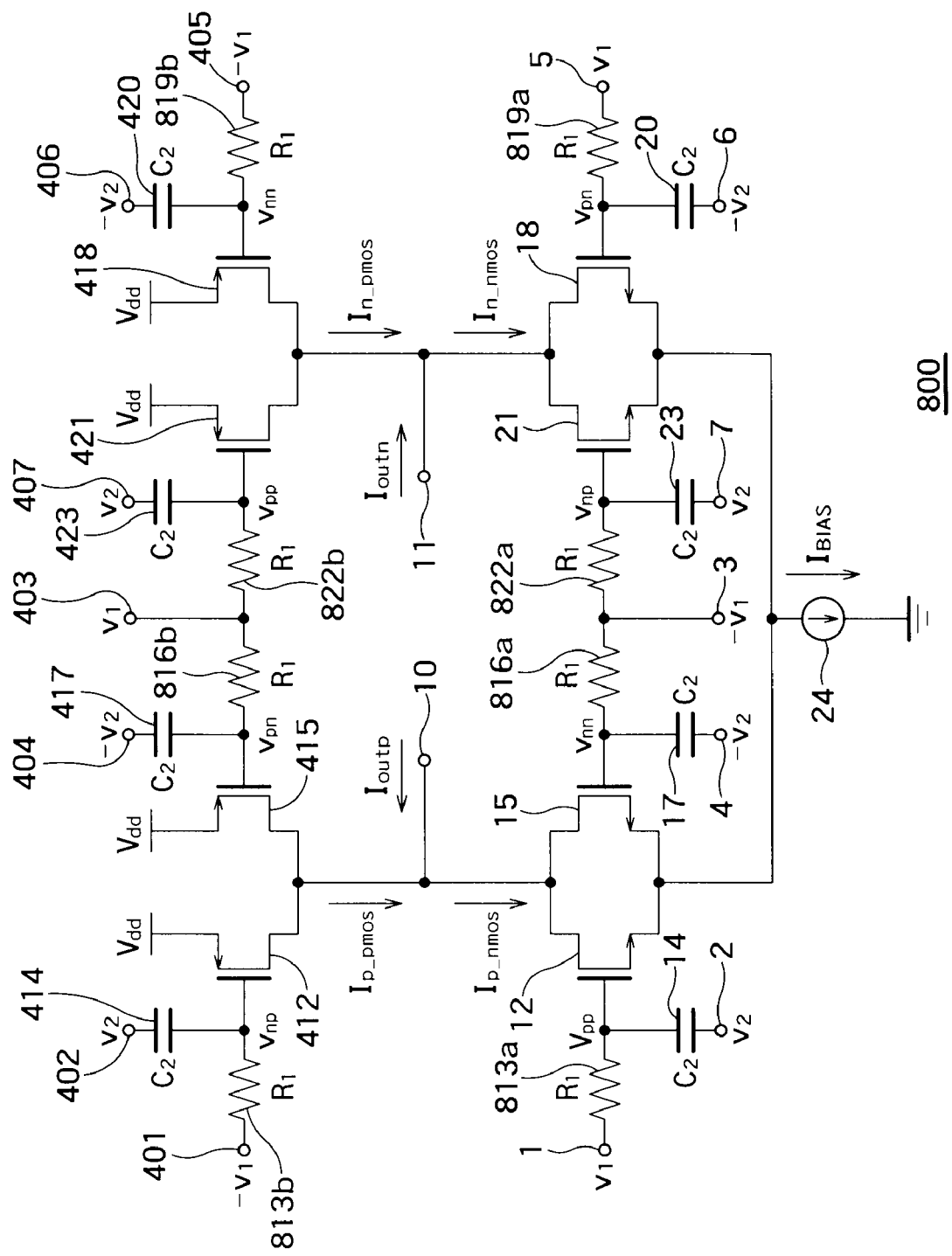
FIG. 8 is a circuit diagram showing the main configuration of the mixer circuit according to an eighth embodiment which is an aspect of the present invention.

FIG. 8 is a circuit diagram showing the main configuration of the mixer circuit according to an eighth embodiment which is an aspect of the present invention. Configurations indicated by the same reference numerals as the fourth embodiment are the same configurations as the fourth embodiment.

As shown in FIG. 8, in a mixer circuit 800, the first capacitor 13 of the mixer circuit 400 described in the fourth embodiment is replaced with a first resistance element 813a. The third capacitor 16 of the mixer circuit 400 is similarly replaced with a second resistance element 816a. The fifth capacitor 19 of the mixer circuit 400 is similarly replaced with a third resistance element 819a. The seventh capacitor 22 of the mixer circuit 400 is similarly replaced with a fourth resistance element 822a.

Further, as shown in FIG. 8, in the mixer circuit 800, the ninth capacitor 413 of the mixer circuit 400 described in the fourth embodiment is replaced with a fifth resistance element 813b. The eleventh capacitor 416 of the mixer circuit 400 is similarly replaced with a sixth resistance element 816b. The thirteenth capacitor 419 of the mixer circuit 400 is similarly replaced with a seventh resistance element 819b. The fifteenth capacitor 422 of the mixer circuit 400 is similarly replaced with an eighth resistance element 822b.

Other configurations of the mixer circuit 800 are similar to the configurations of the mixer circuit 400 described in the fourth embodiment.

The operations of the mixer circuit 800 configured thus are similar to the operations of the mixer circuit 400 described in the fourth embodiment. Thus the mixer circuit 800 outputs output voltages in response to first to fourth input signals.

As in the fifth embodiment, the mixer circuit 800 adds analog signals, which are inputted to input terminals, by capacitive coupling and DC coupling. Thus as in the fifth embodiment, the mixer circuit 800 can be used as the mixer of an RFIC transmitting system.

Moreover, the basic configurations of the transistors in the mixer circuit 800 are similar to the configurations of the transistors of the fourth embodiment, so that the mixer circuit 800 can operate with low voltage and low power.

As described above, the mixer circuit of the present embodiment can perform low-voltage operations with lower power as in the fourth embodiment.

In the foregoing embodiments, the transistors composing the mixer circuit are MOS transistors. In this case, the collector currents of bipolar transistors have exponential characteristics as in the case where the drain currents of the MOS transistors have square-law characteristics. Hence, bipolar transistors may be applied to the present invention as transistors composing the mixer circuit. In this case, the base electrodes of the bipolar transistors correspond to control electrodes. When a first conductivity type corresponds to an NPN type, a second conductivity type corresponds to a PNP type. When the first conductivity type corresponds to the PNP type, the second conductivity type corresponds to the NPN type.

Ninth Embodiment

The first and fifth embodiments described structural examples of the mixer circuit which can be reduced in voltage and power.

In the foregoing mixer circuits, capacitive coupling is used on signal input points to the mixer circuits.

The coupling is made up of capacitors or resistance elements. Instead of these elements, inductors may be used to achieve frequency mixing according to the principles described in the first and fifth embodiments. In other words, by forming the coupling of impedance elements on the signal input points to the mixer circuit, the voltage and power of the mixer circuit can be reduced.

The present embodiment will describe a structural example of a more typical mixer circuit.

In the present embodiment, the coupling of impedance elements is formed on signal input points without changing the basic configurations of the transistors of the mixer circuits described in the first and fifth embodiments. As has been discussed, the impedance elements are capacitors, resistance elements, or inductors.

As in the first embodiment, a DC voltage is biased to the gates of MOS transistors.

Figure 9:
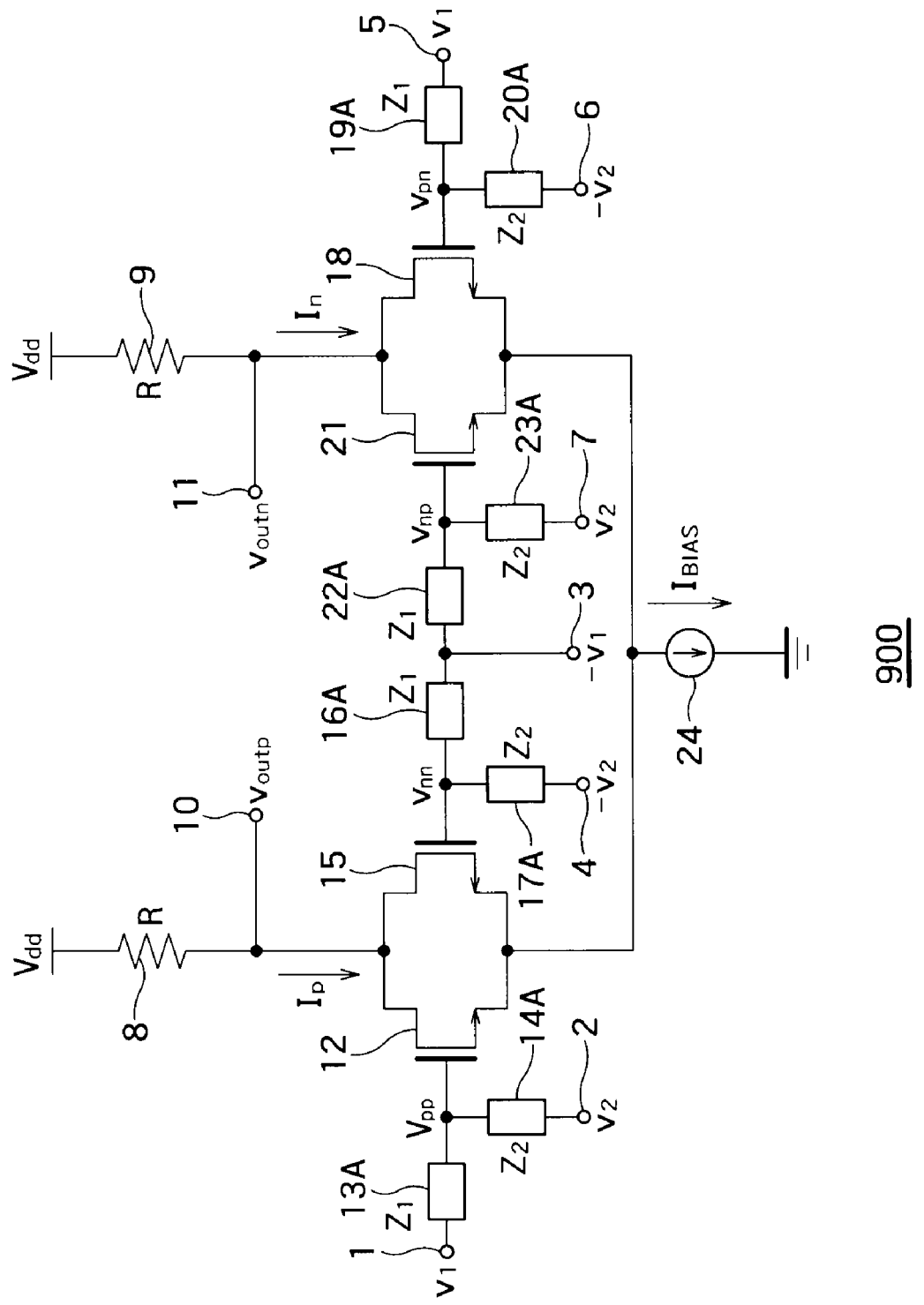
FIG. 9 is a circuit diagram showing the main configuration of a mixer circuit according to a ninth embodiment which is an aspect of the present invention.

FIG. 9 is a circuit diagram showing the main configuration of a mixer circuit according to a ninth embodiment which is an aspect of the present invention. Configurations indicated by the same reference numerals as the first embodiment are the same configurations as the first embodiment.

As shown in FIG. 9, in a mixer circuit 900, the first capacitor 13 of the mixer circuit 100 described in the first embodiment is replaced with a first impedance element 13A. The second capacitor 14 of the mixer circuit 100 is similarly replaced with a second impedance element 14A. The third capacitor 16 of the mixer circuit 100 is similarly replaced with a third impedance element 16A. The fourth capacitor 17 of the mixer circuit 100 is similarly replaced with a fourth impedance element 17A.

The fifth capacitor 19 of the mixer circuit 100 is similarly replaced with a fifth impedance element 19A. The sixth capacitor 20 of the mixer circuit 100 is similarly replaced with a sixth impedance element 20A. The seventh capacitor 22 of the mixer circuit 100 is similarly replaced with a seventh impedance element 22A. The eighth capacitor 23 of the mixer circuit 100 is similarly replaced with an eighth impedance element 23A.

The first, third, fifth, and seventh impedance elements 13A, 16A, 19A, and 22A each have an impedance Z1. The second, fourth, sixth, and eighth impedance elements 14A, 17A, 20A, and 23A each have an impedance Z2.

Other configurations of the mixer circuit 900 are similar to the configurations of the mixer circuit 100 described in the first embodiment.

The operations of the mixer circuit 900 configured thus are similar to the operations of the mixer circuits 100 and 500 described in the first and fifth embodiments. Thus the mixer circuit 900 outputs output voltages in response to first to fourth input signals.

As has been discussed, the mixer circuit 900 adds analog signals, which are inputted to input terminals, by the coupling of the impedance elements. The principle of the addition of the analog signals by the coupling of the impedance elements can be described as in the first and fifth embodiments.

Moreover, the basic configurations of the transistors in the mixer circuit 900 are similar to the configurations of the transistors of the first and fifth embodiments, so that the mixer circuit 900 can operate with low voltage and low power.

As described above, the mixer circuit of the present embodiment can perform low-voltage operations with lower power as in the first and fifth embodiments.

Tenth Embodiment

The ninth embodiment described a more typical structural example of the mixer circuits of the first and fifth embodiments.

In the mixer circuit, capacitive coupling or coupling is used on signal input points to the mixer circuit.

The present embodiment will describe a more typical structural example of the mixer circuits of the second and sixth embodiments.

In the present embodiment, the coupling of impedance elements is formed on signal input points without changing the basic configurations of the transistors of the mixer circuits described in the second and sixth embodiments. As has been discussed, the impedance elements are capacitors, resistance elements, or inductors.

As in the second embodiment, a DC voltage is biased to the gates of MOS transistors.

Figure 10:
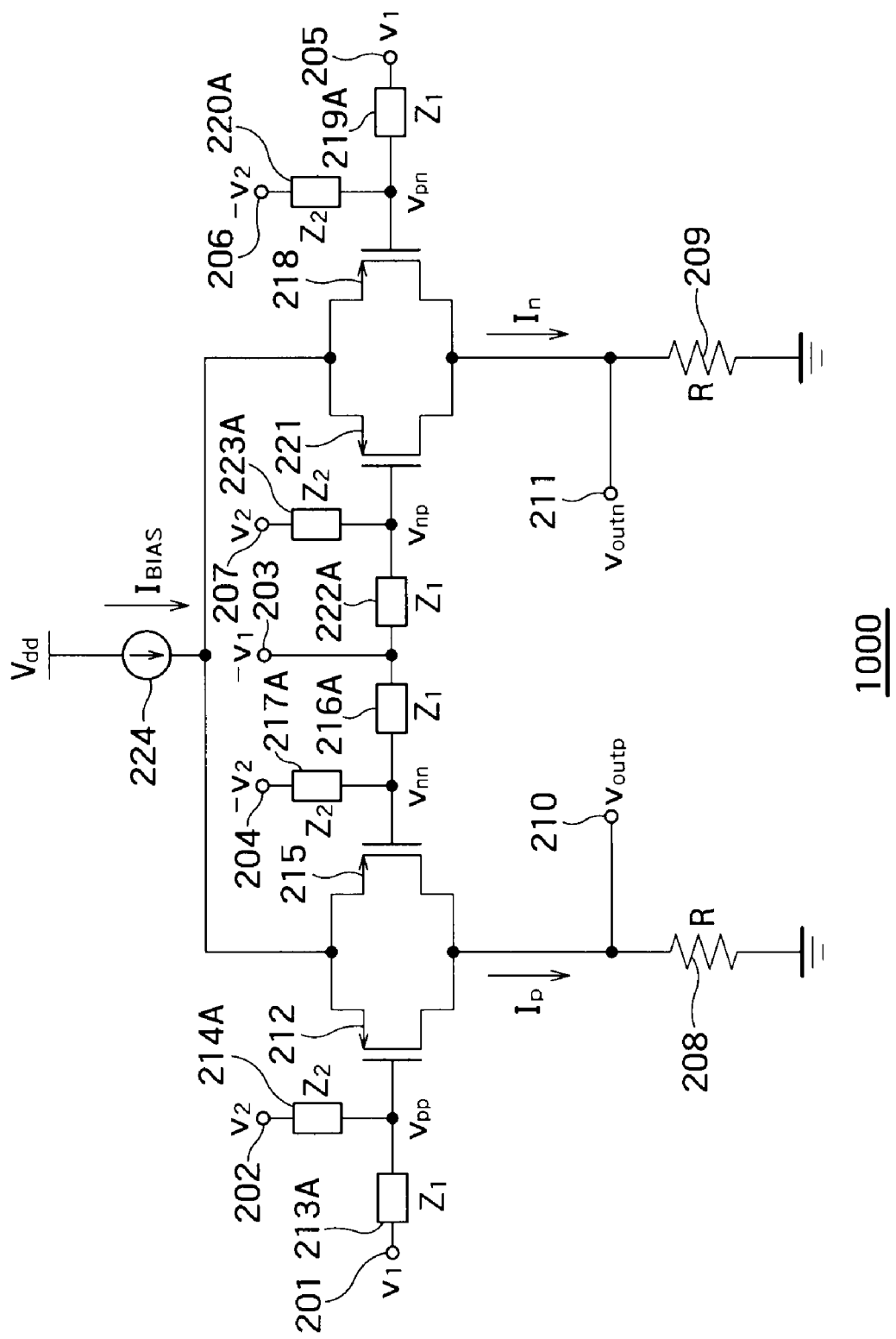
FIG. 10 is a circuit diagram showing the main configuration of a mixer circuit according to a tenth embodiment which is an aspect of the present invention.

FIG. 10 is a circuit diagram showing the main configuration of a mixer circuit according to a tenth embodiment which is an aspect of the present invention. Configurations indicated by the same reference numerals as the second embodiment are the same configurations as the second embodiment.

As shown in FIG. 10, in a mixer circuit 1000, the first capacitor 213 of the mixer circuit 200 described in the second embodiment is replaced with a first impedance element 213A. The second capacitor 214 of the mixer circuit 200 is similarly replaced with a second impedance element 214A. The third capacitor 216 of the mixer circuit 200 is similarly replaced with a third impedance element 216A. The fourth capacitor 217 of the mixer circuit 200 is similarly replaced with a fourth impedance element 217A.

The fifth capacitor 219 of the mixer circuit 200 is similarly replaced with a fifth impedance element 219A. The sixth capacitor 220 of the mixer circuit 200 is similarly replaced with a sixth impedance element 220A. The seventh capacitor 222 of the mixer circuit 200 is similarly replaced with a seventh impedance element 222A. The eighth capacitor 223 of the mixer circuit 200 is similarly replaced with an eighth impedance element 223A.

The first, third, fifth, and seventh impedance elements 213A, 216A, 219A, and 222A each have an impedance Z1. The second, fourth, sixth, and eighth impedance elements 214A, 217A, 220A, and 223A each have an impedance Z2.

Other configurations of the mixer circuit 1000 are similar to the configurations of the mixer circuit 200 described in the second embodiment.

The operations of the mixer circuit 1000 configured thus are similar to the operations of the mixer circuits 200 and 500 described in the second and sixth embodiments. Thus the mixer circuit 1000 outputs output voltages in response to first to fourth input signals.

As has been discussed, the mixer circuit 1000 adds analog signals, which are inputted to input terminals, by the coupling of the impedance elements. The principle of the addition of the analog signals by the coupling of the impedance elements can be described as in the second and sixth embodiments.

Moreover, the basic configurations of the transistors in the mixer circuit 1000 are similar to the configurations of the transistors of the second embodiment, so that the mixer circuit 1000 can operate with low voltage and low power.

As described above, the mixer circuit of the present embodiment can perform low-voltage operations with lower power as in the second and sixth embodiments.

Eleventh Embodiment

The ninth and tenth embodiments described more typical structural examples of the mixer circuit.

In the ninth and tenth embodiments, for example, resistance loads are used as the first and second resistor circuits of the mixer circuits. Transistors may be used as the first and second resistance circuits as in the third embodiment.

The present embodiment will describe a structural example of a mixer circuit using transistors as first and second resistor circuits. In this example, transistors are used as the first and second resistor circuits of the mixer circuit described in the first embodiment.

As in the ninth embodiment, a DC voltage is biased to the gates of MOS transistors but is canceled in the examination of output characteristics. Thus a direct current is not considered in the present embodiment.

Figure 11:
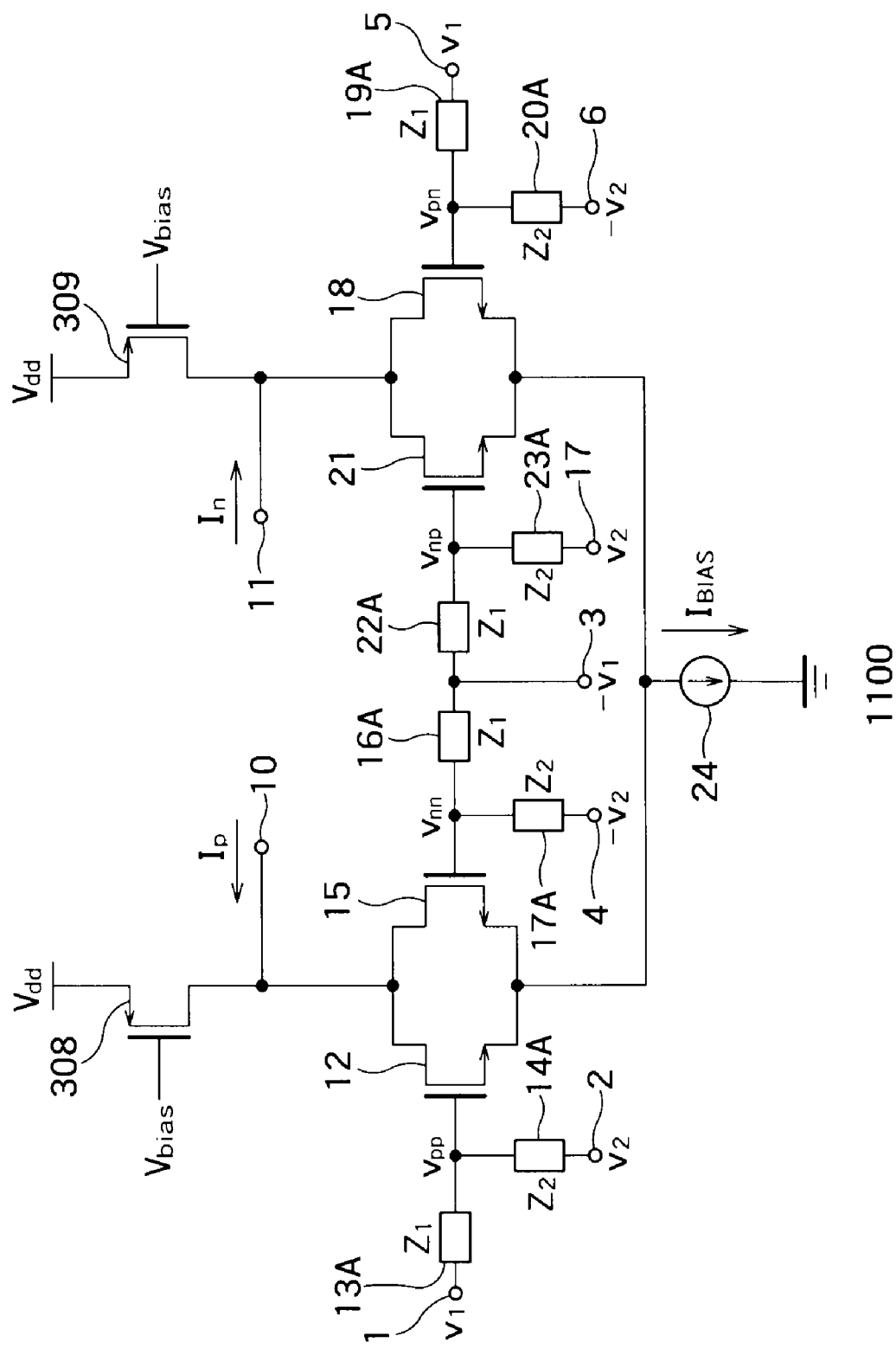
FIG. 11 is a circuit diagram showing the main configuration of the mixer circuit according to an eleventh embodiment which is an aspect of the present invention.

FIG. 11 is a circuit diagram showing the main configuration of the mixer circuit according to an eleventh embodiment which is an aspect of the present invention. Configurations indicated by the same reference numerals as the ninth embodiment are the same configurations as the ninth embodiment.

As shown in FIG. 11, a first resistor circuit and a second resistor circuit of a mixer circuit 1100 are made up of p-type MOS transistors 308 and 309, each having a control electrode (gate) connected to a fixed potential Vbias. These p-type MOS transistors 308 and 309 also act as current sources.

In the configuration of the mixer circuit 1100, when it is assumed that the p-type MOS transistors 308 and 309 have infinite output impedances, first and second output terminals 10 and 11 output currents.

Further, voltages can be outputted by disposing a current/voltage converting circuit downstream of the mixer circuit 1100.

The mixer circuit 1100 configured thus outputs the output voltages in response to first to fourth input signals as in the ninth embodiment.

Further, as in the ninth embodiment, the mixer circuit 1100 adds analog signals, which are inputted to input terminals, by the coupling of impedance elements.

Thus as in the ninth embodiment, the mixer circuit of the eleventh embodiment can eliminate the need for an adding circuit of analog signals unlike the prior art in which power is consumed because of the DC bias currents of transistors. Hence the mixer circuit of the eleventh embodiment can operate with lower power than in the prior art.

As described above, the mixer circuit of the present embodiment can perform low-voltage operations with lower power.

Twelfth Embodiment

The ninth and tenth embodiments described more typical structural examples of the mixer circuit.

The present embodiment will describe a more typical structural example of the mixer circuit of the eighth embodiment.

In the present embodiment, the coupling of impedance elements is formed on signal input points without changing the basic configurations of the transistors of the mixer circuit described in the eighth embodiment. As has been discussed, the impedance elements are capacitors, resistance elements, or inductors.

As in the eighth embodiment, a DC voltage is biased to the gates of MOS transistors.

Figure 12:
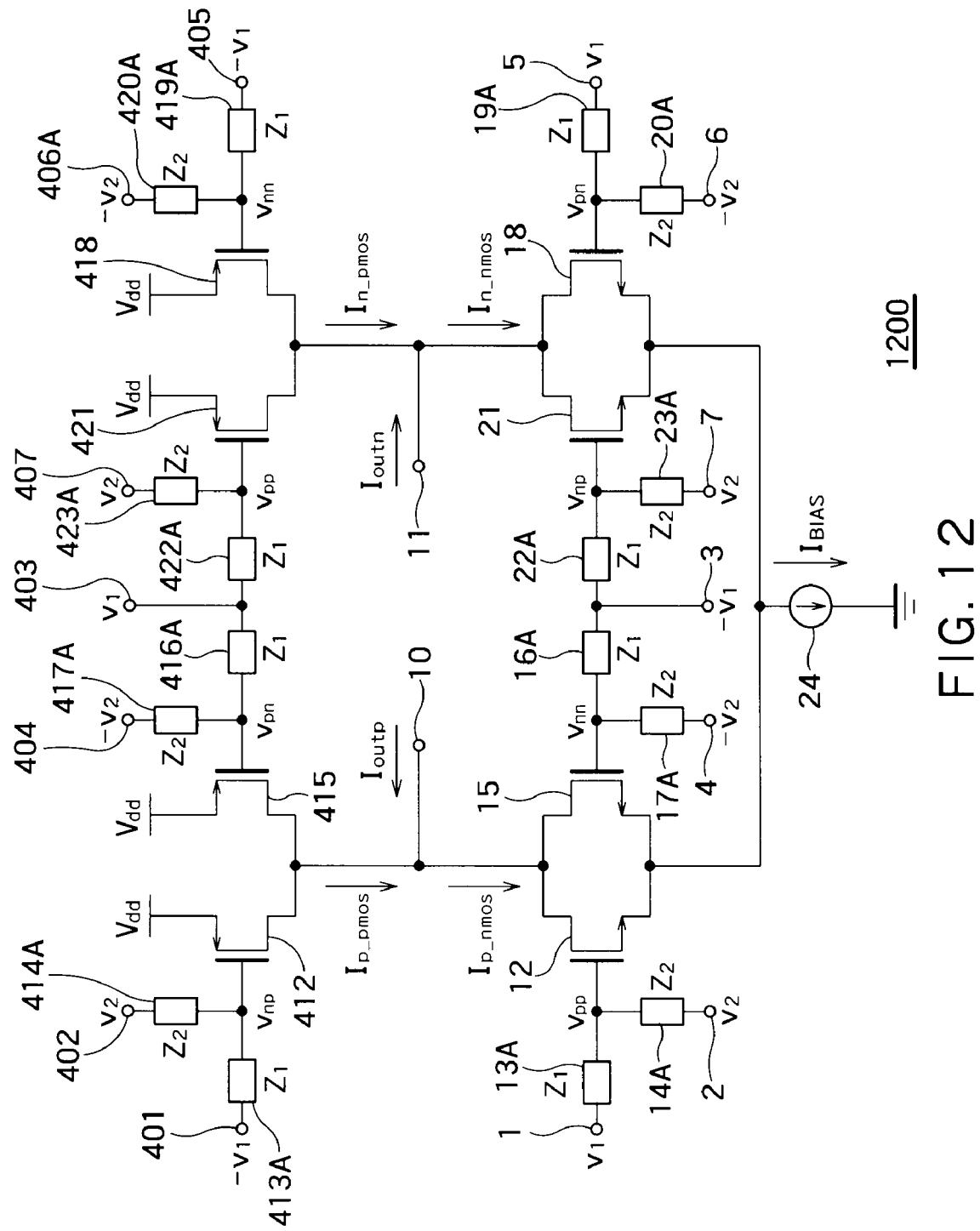
FIG. 12 is a circuit diagram showing the main configuration of a mixer circuit according to a twelfth embodiment which is an aspect of the present invention.

FIG. 12 is a circuit diagram showing the main configuration of a mixer circuit according to a twelfth embodiment which is an aspect of the present invention. Configurations indicated by the same reference numerals as the eighth embodiment are the same configurations as the eighth embodiment.

As shown in FIG. 12, in a mixer circuit 1200, the first capacitor 13 of the mixer circuit 800 described in the eighth embodiment is replaced with a first impedance element 13A. The second capacitor 14 of the mixer circuit 800 is similarly replaced with a second impedance element 14A. The third capacitor 16 of the mixer circuit 800 is similarly replaced with a third impedance element 16A. The fourth capacitor 17 of the mixer circuit 800 is similarly replaced with a fourth impedance element 17A.

The fifth capacitor 19 of the mixer circuit 800 is similarly replaced with a fifth impedance element 19A. The sixth capacitor 20 of the mixer circuit 800 is similarly replaced with a sixth impedance element 20A. The seventh capacitor 22 of the mixer circuit 800 is similarly replaced with a seventh impedance element 22A. The eighth capacitor 23 of the mixer circuit 800 is similarly replaced with an eighth impedance element 23A.

The ninth capacitor 413 of the mixer circuit 800 is similarly replaced with a ninth impedance element 413A. The tenth capacitor 414 of the mixer circuit 800 is similarly replaced with a tenth impedance element 414A. The eleventh capacitor 416 of the mixer circuit 800 is similarly replaced with an eleventh impedance element 416A. The twelfth capacitor 417 of the mixer circuit 800 is similarly replaced with a twelfth impedance element 417A.

The thirteenth capacitor 419 of the mixer circuit 800 is similarly replaced with a thirteenth impedance element 419A. The fourteenth capacitor 420 of the mixer circuit 800 is similarly replaced with a fourteenth impedance element 420A. The fifteenth capacitor 422 of the mixer circuit 800 is similarly replaced with a fifteenth impedance element 422A. The sixteenth capacitor 423 of the mixer circuit 800 is similarly replaced with a sixteenth impedance element 423A.

The first, third, fifth, seventh, ninth, eleventh, thirteenth, fifteen, and seventeenth impedance elements 13A, 16A, 19A, 22A, 413A, 416A, 419A, and 422A each have an impedance Z1.

The second, fourth, sixth, eighth, tenth, twelfth, fourteenth, and sixteenth impedance elements 14A, 17A, 20A, 23A, 414A, 417A, 420A, and 423A each have an impedance Z2.

Other configurations of the mixer circuit 1200 are similar to the configurations of the mixer circuit 800 illustrated in the eighth embodiment.

The operations of the mixer circuit 1200 configured thus are similar to the operations of the mixer circuit 800 described in the eighth embodiment. Thus the mixer circuit 1200 outputs output voltages in response to first to fourth input signals.

As has been discussed, the mixer circuit 1200 adds analog signals, which are inputted to input terminals, by the coupling of the impedance elements. The principle of the addition of the analog signals by the coupling of the impedance elements can be described as in the second and sixth embodiments.

Moreover, the basic configurations of the transistors in the mixer circuit 1200 are similar to the configurations of the transistors of the second embodiment, so that the mixer circuit 1200 can operate with low voltage and low power.

As described above, the mixer circuit of the present embodiment can perform low-voltage operations with lower power as in the second and sixth embodiments.

Thirteenth Embodiment

The twelfth embodiment described a more typical structural example of the mixer circuit of the eighth embodiment.

The present embodiment will describe a structural example for stabilizing the common code voltage of the output terminal of the mixer circuit described in the twelfth embodiment.

Figure 13:
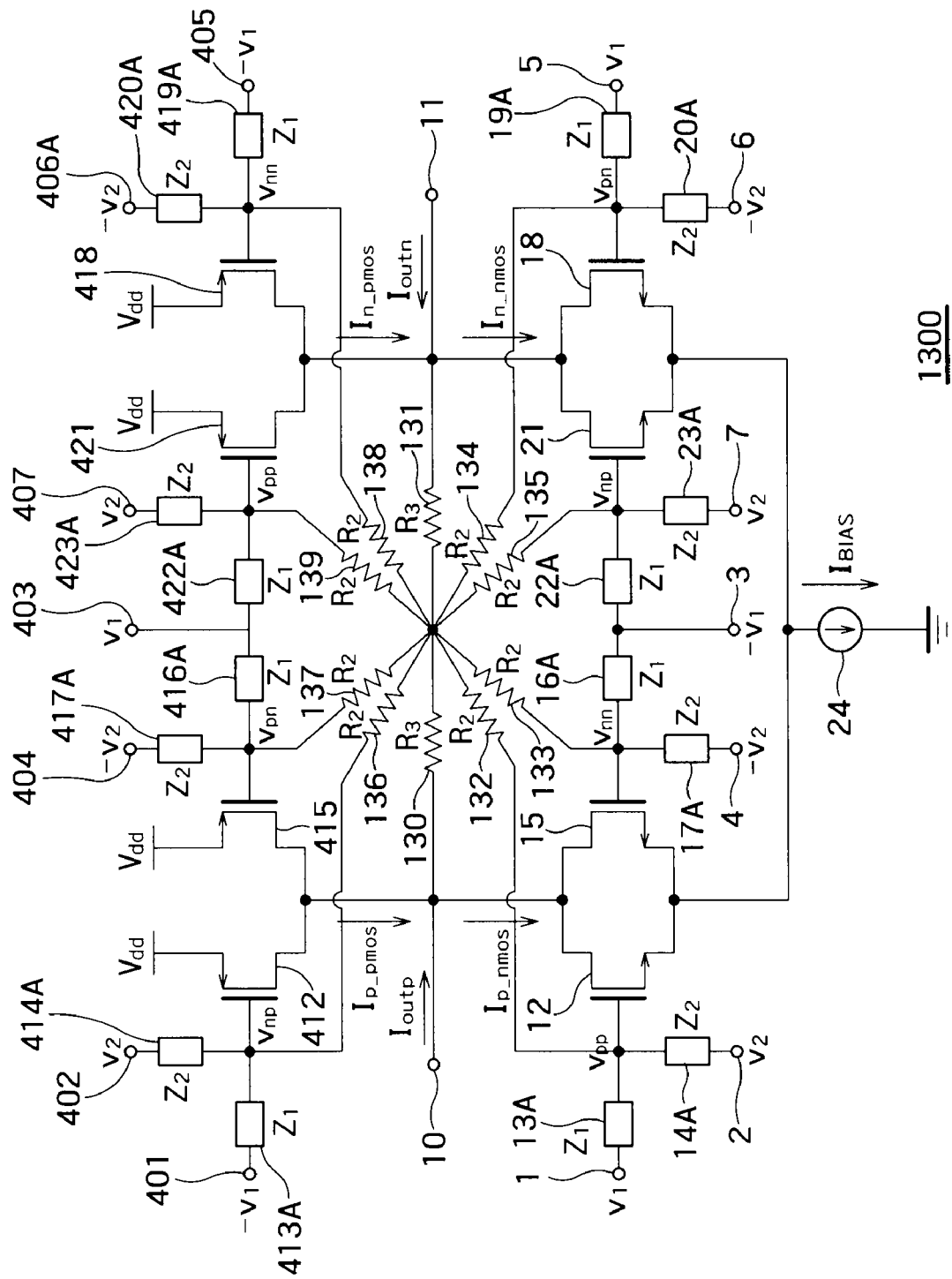
FIG. 13 is a circuit diagram showing the main configuration of a mixer circuit according to the thirteenth embodiment which is an aspect of the present invention.

FIG. 13 is a circuit diagram showing the main configuration of a mixer circuit according to the thirteenth embodiment which is an aspect of the present invention. Configurations indicated by the same reference numerals as the twelfth embodiment are the same configurations as the twelfth embodiment.

As shown in FIG. 13, unlike the mixer circuit 1200 of the twelfth embodiment, a mixer circuit 1300 further includes a first bias resistance element 130, a second bias resistance element 131, a third bias resistance element 132, a fourth bias resistance element 133, a fifth bias resistance element 134, a sixth bias resistance element 135, a seventh bias resistance element 136, an eighth bias resistance element 137, a ninth bias resistance element 138, and a tenth bias resistance element 139.

The first bias resistance element 130 has one end connected to a first output terminal 10.

The second bias resistance element 131 has one end connected to a second output terminal 11 and the other end connected to the other end of the first bias resistance element 130.

The third bias resistance element 132 is connected between a contact 140 between the other end of the first bias resistance element 130 and the other end of the second bias resistance element 131 and the control electrode of a first transistor 12.

The fourth bias resistance element 133 is connected between the contact 140 and the control electrode of a second transistor 15.

The fifth bias resistance element 134 is connected between the contact 140 and the control electrode of a third transistor 18.

The sixth bias resistance element 135 is connected between the contact 140 and the control electrode of a fourth transistor 21.

The seventh bias resistance element 136 is connected between the contact 140 and the control electrode of a fifth transistor 412.

The eighth bias resistance element 137 is connected between the contact 140 and the control electrode of a sixth transistor 415.

The ninth bias resistance element 138 is connected between the contact 140 and the control electrode of a seventh transistor 418.

The tenth bias resistance element 139 is connected between the contact 140 and the control electrode of an eighth transistor 421.

As described above, the first to eighth transistors 12, 15, 18, 21, 412, 415, 418, and 421 are diode-connected in terms of direct current. Thus the common mode voltages of the first and second output terminals 10 and 11 are stabilized at a potential divided between a power supply potential Vdd and a ground potential by the diode-connected transistors.

The first and second bias resistance elements 130 and 131 have, for example, a resistance value R3. The third to tenth bias resistance elements 132 to 139 have, for example, a resistance value R2. The first to tenth bias resistance elements 130 to 139 are set according to the set values of the common mode voltages of the first and second output terminals 10 and 11.

In this configuration, the transistors of the mixer circuit 1300 have to be operated in a saturated region. Since the transistors are diode-connected in terms of direct current, the transistors are DC biased so as to operate in a saturated region.

Further, it is not necessary to provide a common mode feedback circuit in which the stability of output voltage has to be considered.

The mixer circuit 1300 configured thus outputs output voltages in response to first to fourth input signals as in the twelfth embodiment.

Further, as in the twelfth embodiment, the mixer circuit 1300 adds analog signals, which are inputted to input terminals, by the coupling of impedance elements.

Thus as in the twelfth embodiment, the mixer circuit of the thirteenth embodiment can eliminate the need for an adding circuit of analog signals unlike the prior art in which power is consumed because of the DC bias currents of transistors. Hence the mixer circuit of the thirteenth embodiment can operate with lower power than in the prior art.

As described above, the mixer circuit of the present embodiment can perform low-voltage operations with lower power.

Fourteenth Embodiment

A fourteenth embodiment will describe an example of a radio communication terminal to which the mixer circuits of the foregoing embodiments are applied. In the following explanation, the mixer circuit 100 of the first embodiment is applied to a radio communication terminal. The mixer circuits of the other embodiments are similarly applicable.

Figure 14:
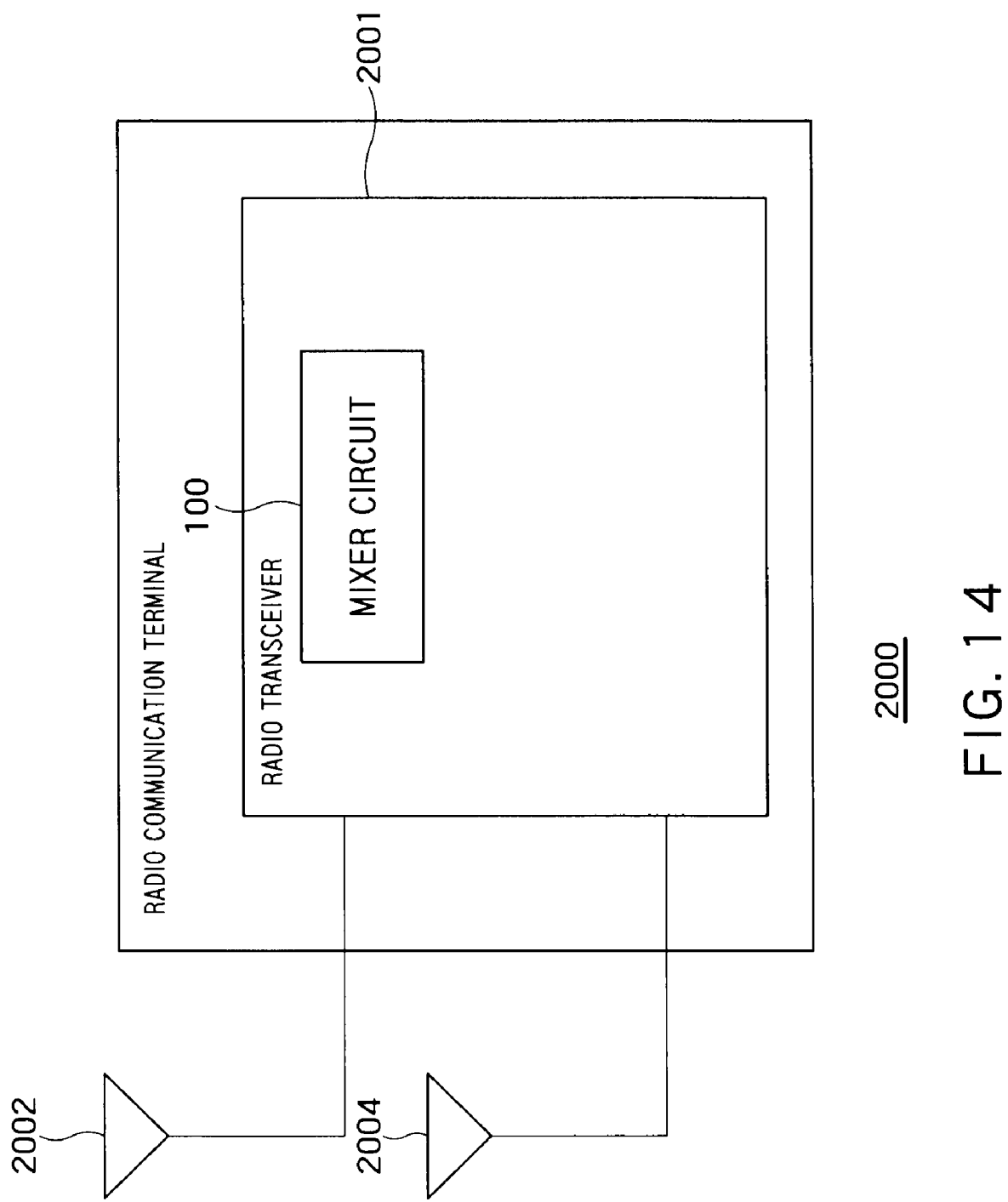
FIG. 14 is a figure showing a main configuration of a radio communication terminal 2000 to which the mixer circuits of the present invention are applicable.

FIG. 14 shows the main configuration of a radio communication terminal 2000 to which the mixer circuits of the present invention are applicable.

As shown in FIG. 14, the radio communication terminal 2000 includes a radio transceiver 2001. The radio communication terminal 2000 is, for example, a cellular phone, a personal data assistant (PDA), and so on.

The radio transceiver 2001 receives signals via a receiving antenna 2004, performs signal processing on the signals, and outputs the signals to an internal circuit (not shown). Further, the radio transceiver 2001 processes signals outputted from the internal circuit and transmits the signals from a transmitting antenna 2002. The mixer circuit 100 provided in the radio transceiver 2001 is used for mixing the signals during the processing of the signals.

What is claimed is:

1. A mixer circuit comprising:
a first adder configured to output a first output signal by adding a first voltage signal and a second voltage signal;
a second adder configured to output a second output signal by adding an inverted signal of the first voltage signal and an inverted signal of the second voltage signal;
a third adder configured to output a third output signal by adding the inverted signal of the first voltage signal and the second voltage signal;
a fourth adder configured to output a fourth output signal by adding the first voltage signal and the inverted signal of the second voltage signal;
a first square circuit configured to output a fifth output signal by squaring the first output signal;
a second square circuit configured to output a sixth output signal by squaring the second output signal;
a third square circuit configured to output a seventh output signal by squaring the third output signal; and
a fourth square circuit configured to output a eighth output signal by squaring the fourth output signal.

2. A mixer circuit comprising:
a first adder comprising a first input terminal fed with a first voltage signal and a second input terminal fed with a second voltage signal, and configured to output a first output signal by adding the first voltage signal and the second voltage signal;
a second adder comprising a third input terminal fed with an inverted signal of the first voltage signal and a fourth input terminal fed with an inverted signal of the second voltage signal, and configured to output a second output signal by adding the inverted signal of the first voltage signal and the inverted signal of the second voltage signal;
a third adder comprising a fifth input terminal fed with the inverted signal of the first voltage signal and a sixth input terminal fed with the second voltage signal, and configured to output a third output signal by adding the inverted signal of the first voltage signal and the second voltage signal;
a fourth adder comprising a seventh input terminal fed with the first voltage signal and a eighth input terminal fed with the inverted signal of the second voltage signal, and configured to output a fourth output signal by adding the first voltage signal and the inverted signal of the second voltage signal;
a first square circuit comprising a ninth input terminal fed with the first output signal and a first output terminal to output a fifth output signal by squaring the first output signal;
a second square circuit comprising a tenth input terminal fed with the second output signal and a second output terminal to output a sixth output signal by squaring the second output signal;
a third square circuit comprising a eleventh input terminal fed with the third output signal and a third output terminal to output a seventh output signal by squaring the third output signal; and a fourth square circuit comprising a twelfth input terminal fed with the fourth output signal and a fourth output terminal to output a eighth output signal by squaring the fourth output signal.

3. The mixer circuit of claim 2, wherein the first to fourth adders each have a first impedance element and a second impedance element.

4. The mixer circuit of claim 2, wherein the first to fourth square circuits are MOS transistors.

5. The mixer circuit of claim 4, wherein the ninth to twelfth terminals are gate electrodes of the MOS transistors.

6. The mixer circuit of claim 4, wherein the MOS transistors are same conductivity type.

7. The mixer circuit of claim 4, wherein one of a source terminal or a drain terminal of the MOS transistor is connected to a first voltage potential via a third impedance element.

8. The mixer circuit of claim 7, wherein the other of the source terminal or the drain terminal of the MOS transistor is connected to a current source.

* * * * *